US007444575B2

(12) United States Patent  
Ong

(10) Patent No.: US 7,444,575 B2  
(45) Date of Patent: Oct. 28, 2008

(54) ARCHITECTURE AND METHOD FOR TESTING OF AN INTEGRATED CIRCUIT DEVICE

(75) Inventor: Adrian E. Ong, Pleasanton, CA (US)

(73) Assignee: Inapac Technology, Inc., San Jose, CA (US)

( * ) Notice: Subject to any disclaimer, the term of this patent is extended or adjusted under 35 U.S.C. 154(b) by 149 days.

(21) Appl. No.: 11/207,518

(22) Filed: Aug. 19, 2005

(65) Prior Publication Data

US 2005/0289428 A1 Dec. 29, 2005

Related U.S. Application Data

(63) Continuation-in-part of application No. 10/877,687, filed on Jun. 25, 2004, which is a continuation-in-part of application No. 09/666,208, filed on Sep. 21, 2000, now Pat. No. 6,732,304, which is a continuation of application No. 09/967,389, filed on Sep. 28, 2001, now Pat. No. 6,754,866, said application No. 11/207,518 is a continuation-in-part of application No. 11/108,385, filed on Apr. 18, 2005, which is a continuation of application No. 10/608,613, filed on Jun. 27, 2003, now Pat. No. 6,882,171, which is a continuation-in-part of application No. 10/305,635, filed on Nov. 27, 2002, now Pat. No. 6,812,726, which is a continuation-in-part of application No. 10/679,673, filed on Oct. 3, 2003, now Pat. No. 7,006,940.

(51) Int. Cl.  
*G01R 31/28* (2006.01)  
*G06F 11/00* (2006.01)

(52) U.S. Cl. .................. 714/742; 714/724

(58) Field of Classification Search .............. 714/718, 714/724–725, 742, 745, 733–734, 738, 776; 702/117, 118, 60; 365/200, 201; 324/765, 324/736, 73.1, 158  
See application file for complete search history.

(56) References Cited

U.S. PATENT DOCUMENTS

| | | | |
|---|---|---|---|
| 4,263,650 A | 4/1981 | Bennett et al. | |
| 4,698,830 A | 10/1987 | Barzilai et al. | |
| 4,743,841 A | 5/1988 | Takeuchi | |
| 4,773,028 A | 9/1988 | Tallman | |
| 4,825,414 A | 4/1989 | Kawata | |
| 4,873,669 A | 10/1989 | Furutani et al. | |
| 5,151,881 A | 9/1992 | Kajigaya et al. | |
| 5,251,095 A | 10/1993 | Miller et al. | |
| 5,271,019 A * | 12/1993 | Edwards et al. ............ | 714/730 |
| 5,301,156 A | 4/1994 | Talley | |
| 5,326,428 A | 7/1994 | Farnworth et al. | |
| 5,388,104 A | 2/1995 | Shirotori et al. | |
| 5,418,452 A | 5/1995 | Pyle | |
| 5,457,400 A | 10/1995 | Ahmad et al. | |
| 5,477,545 A | 12/1995 | Huang | |

(Continued)

*Primary Examiner*—Phung M Chung  
(74) *Attorney, Agent, or Firm*—Sidley Austin LLP

(57) ABSTRACT

In one embodiment, the present invention provides a platform of hardware and/or software that enables the complete access and reliable testing of multiple integrated circuit (IC) devices within a package. This platform may include a testing component (e.g., test circuits, test pads, shared pads, etc.), one or more probe cards and related hardware, wafer probe programs, load board and related hardware of external test equipment, and software and routines for final test programs.

54 Claims, 20 Drawing Sheets

U.S. PATENT DOCUMENTS

| | | | |
|---|---|---|---|
| 5,479,105 A | 12/1995 | Kim et al. | |
| 5,499,250 A * | 3/1996 | Ingalls et al. | 714/745 |
| 5,506,499 A | 4/1996 | Puar | |
| 5,523,697 A | 6/1996 | Farnworth et al. | |
| 5,535,165 A | 7/1996 | Davis et al. | |
| 5,594,694 A | 1/1997 | Roohparvar | |
| 5,604,432 A | 2/1997 | Moore et al. | |
| 5,619,461 A | 4/1997 | Roohparvar | |
| 5,657,284 A | 8/1997 | Beffa | |
| 5,677,885 A | 10/1997 | Roohparvar | |
| 5,719,438 A | 2/1998 | Beilstein et al. | |
| 5,751,015 A | 5/1998 | Corbett et al. | |
| 5,751,987 A | 5/1998 | Mahant Shetti et al. | |
| 5,801,452 A | 9/1998 | Farnworth et al. | |
| 5,805,609 A | 9/1998 | Mote, Jr. | |
| 5,807,762 A | 9/1998 | Akram et al. | |
| 5,825,697 A | 10/1998 | Gilliam et al. | |
| 5,825,782 A | 10/1998 | Roohparvar | |
| 5,923,600 A | 7/1999 | Momohara | |
| 5,925,142 A | 7/1999 | Raad et al. | |
| 5,936,260 A | 8/1999 | Corbett et al. | |
| 5,959,310 A | 9/1999 | Akram et al. | |
| 5,966,388 A | 10/1999 | Wright et al. | |
| 5,995,379 A | 11/1999 | Kyougoku et al. | |
| 6,011,720 A | 1/2000 | Tanaka | |
| 6,026,039 A | 2/2000 | Kim et al. | |
| 6,047,393 A | 4/2000 | Yamada | |
| 6,069,483 A | 5/2000 | Maxwell et al. | |
| 6,072,326 A | 6/2000 | Akram et al. | |
| 6,087,676 A | 7/2000 | Akram et al. | |
| 6,100,708 A | 8/2000 | Mizuta | |
| 6,100,716 A | 8/2000 | Adham et al. | |
| 6,104,658 A | 8/2000 | Lu | |
| 6,104,664 A | 8/2000 | Ohno | |
| 6,137,167 A | 10/2000 | Ahn et al. | |
| 6,154,860 A | 11/2000 | Wright et al. | |
| 6,157,046 A | 12/2000 | Corbett et al. | |
| 6,188,232 B1 | 2/2001 | Akram et al. | |
| 6,191,603 B1 | 2/2001 | Muradali et al. | |
| 6,194,738 B1 | 2/2001 | Debenham et al. | |
| 6,208,157 B1 | 3/2001 | Akram et al. | |
| 6,216,241 B1 | 4/2001 | Fenstermaker et al. | |
| 6,243,839 B1 | 6/2001 | Roohparvar | |
| 6,243,840 B1 | 6/2001 | Raad et al. | |
| 6,263,463 B1 | 7/2001 | Hashimoto | |
| 6,274,937 B1 | 8/2001 | Ahn et al. | |
| 6,286,115 B1 | 9/2001 | Stubbs | |
| 6,294,839 B1 | 9/2001 | Mess et al. | |
| 6,298,001 B1 | 10/2001 | Lee et al. | |
| 6,298,429 B1 | 10/2001 | Scott et al. | |
| 6,300,782 B1 | 10/2001 | Hembree et al. | |
| 6,310,484 B1 | 10/2001 | Akram et al. | |
| 6,320,201 B1 | 11/2001 | Corbett et al. | |
| 6,351,681 B1 | 2/2002 | Chih et al. | |
| RE37,611 E | 3/2002 | Roohparvar | |
| 6,365,421 B2 | 4/2002 | Debenham et al. | |
| 6,366,487 B1 | 4/2002 | Yeom | |
| 6,392,948 B1 | 5/2002 | Lee | |
| 6,395,565 B1 | 5/2002 | Akram et al. | |
| 6,396,291 B1 | 5/2002 | Akram et al. | |
| 6,407,566 B1 | 6/2002 | Brunelle et al. | |
| 6,441,479 B1 | 8/2002 | Ahn et al. | |
| 6,445,625 B1 | 9/2002 | Abedifard | |
| 6,456,099 B1 | 9/2002 | Eldridge et al. | |
| 6,470,484 B1 | 10/2002 | Day et al. | |
| 6,472,747 B2 | 10/2002 | Bazarjani et al. | |
| 6,483,760 B2 | 11/2002 | Kang | |
| 6,484,279 B2 | 11/2002 | Akram | |
| 6,502,215 B2 | 12/2002 | Raad et al. | |
| 6,507,885 B2 | 1/2003 | Lakhani et al. | |
| 6,519,171 B2 | 2/2003 | Matsuzaki et al. | |
| 6,519,725 B1 | 2/2003 | Huisman et al. | |
| 6,675,269 B2 | 1/2004 | Miura et al. | |
| 6,708,264 B1 | 3/2004 | Abe et al. | |
| 6,711,042 B2 | 3/2004 | Ishikawa | |
| 6,791,175 B2 | 9/2004 | Matsuo et al. | |
| 6,801,461 B2 | 10/2004 | Hii et al. | |
| 6,825,683 B1 | 11/2004 | Berndt et al. | |
| 6,996,754 B1 | 2/2006 | Lee | |
| 2002/0017720 A1 | 2/2002 | Nishizawa et al. | |
| 2002/0117729 A1 | 8/2002 | Aiki et al. | |
| 2003/0235929 A1 | 12/2003 | Cowles et al. | |
| 2004/0027150 A1 | 2/2004 | Miura et al. | |
| 2004/0100296 A1 | 5/2004 | Ong | |
| 2004/0150089 A1 | 8/2004 | Inoue et al. | |
| 2004/0196709 A1 | 10/2004 | Ong | |
| 2004/0232559 A1 | 11/2004 | Adelmann | |

* cited by examiner

| Item | Test Mode Description | Code Name | Persist | TDQ (Test Code) | | | | | | | |
|---|---|---|---|---|---|---|---|---|---|---|---|
| | | | | 7 | 6 | 5 | 4 | 3 | 2 | 1 | 0 |
| 1 | No Test | | | 0 | 0 | x | x | x | 0 | 0 | 0 |
| 2 | Load Row Address (A0-A7) | LRA07 | | 0 | 0 | x | x | x | 0 | 0 | 1 |
| 3 | Load Row Address (A8-A15) | LRA815 | | 0 | 0 | x | x | x | 0 | 1 | 0 |
| 4 | Reserve for Row Address | | | 0 | 0 | x | x | x | 0 | 1 | 1 |
| 5 | Set Row Counter LSB (A0-A7) | SRLSB07 | | 0 | 0 | x | x | x | 1 | 0 | 0 |
| 6 | Set Row Counter LSB (A8-A15) | SRLSB815 | | 0 | 0 | x | x | x | 1 | 0 | 1 |
| 7 | Reserve for Row LSB | | | 0 | 0 | x | x | x | 1 | 1 | 0 |
| 8 | Set Row Counter to Count Down | RCNTD | Y | 0 | 0 | x | x | x | 1 | 1 | 1 |
| 9 | No Test | | | 0 | 0 | 0 | 0 | 0 | x | x | x |
| 10 | Load Column Address (A0-A7) | LCA07 | | 0 | 0 | 0 | 0 | 1 | x | x | x |
| 11 | Load Column Address (A8-A15) | LCA815 | | 0 | 0 | 0 | 1 | 0 | x | x | x |
| 12 | Reserve for Column Address | | | 0 | 0 | 0 | 1 | 1 | x | x | x |
| 13 | Set Column Counter LSB (A0-A7) | SCLSB07 | | 0 | 0 | 1 | 0 | 0 | x | x | x |
| 14 | Set Column Counter LSB (A8-A15) | SCLSB815 | | 0 | 0 | 1 | 0 | 1 | x | x | x |
| 15 | Reserve for Column LSB | | | 0 | 0 | 1 | 1 | 0 | x | x | x |
| 16 | Set Column Counter to Count Down | CCNTD | Y | 0 | 0 | 1 | 1 | 1 | x | x | x |

*FIG. 3A*

| Item | Test Mode Description | Code Name | Persist | TDQ (Test Code) | | | | | | | |
|---|---|---|---|---|---|---|---|---|---|---|---|
| | | | | 7 | 6 | 5 | 4 | 3 | 2 | 1 | 0 |
| 17 | No Test | | | 0 | 1 | x | x | x | 0 | 0 | 0 |
| 18 | Load MRS Address (A0-A7) | LMR07 | | 0 | 1 | x | x | x | 0 | 0 | 1 |
| 19 | Load MRS Address (A8-A15) | LMR815 | | 0 | 1 | x | x | x | 0 | 1 | 0 |
| 20 | Reserve for MRS Address | | | 0 | 1 | x | x | x | 0 | 1 | 1 |
| 21 | Reserve | | | 0 | 1 | x | x | x | 1 | 0 | 0 |
| 22 | Reserve | | | 0 | 1 | x | x | x | 1 | 0 | 1 |
| 23 | Enable Chip ID Read Out | CHID | Y | 0 | 1 | x | x | x | 1 | 1 | 0 |
| 24 | Reserve | | | 0 | 1 | x | x | x | 1 | 1 | 1 |
| 25 | No Test | | | 0 | 1 | 0 | 0 | 0 | x | x | x |
| 26 | Load Data Background Scramble | TOPO | Y | 0 | 1 | 0 | 0 | 1 | x | x | x |
| 27 | Uncompress Data-out | T4B | Y | 0 | 1 | 0 | 1 | 0 | x | x | x |
| 28 | Reserve | | | 0 | 1 | 0 | 1 | 1 | x | x | x |
| 29 | Reserve | | | 0 | 1 | 1 | 0 | 0 | x | x | x |
| 30 | Invert Odd Data Bit | TINVO | Y | 0 | 1 | 1 | 0 | 1 | x | x | x |
| 31 | Enable DDR Operation | TDDR | Y | 0 | 1 | 1 | 1 | 0 | x | x | x |
| 32 | Reserve | | | 0 | 1 | 1 | 1 | 1 | x | x | x |

*FIG. 3B*

| Tester Data-In | Burst Address LSB (CA0) | Even Data Bit First | Default Mode | | | | DQ Output | | | |
|---|---|---|---|---|---|---|---|---|---|---|
| | | | DWe0 | DWo0 | DWe1 | DWo1 | Q0 | Q1 | Q2 | Q3 |
| 0 | 0 | Yes | 0 | 0 | 0 | 0 | 0 | 0 | 0 | 0 |
| 1 | 0 | Yes | 1 | 1 | 1 | 1 | 1 | 1 | 1 | 1 |
| 0 | 1 | No | 0 | 0 | 0 | 0 | 0 | 0 | 0 | 0 |
| 1 | 1 | No | 1 | 1 | 1 | 1 | 1 | 1 | 1 | 1 |

| Tester Data-In TDQ | Burst Address LSB CA0 | Even Data Bit First EV1ST | Invert Odd Bit (TINVO) | | | | DQ Output | | | |
|---|---|---|---|---|---|---|---|---|---|---|
| | | | DWe0 | DWo0 | DWe1 | DWo1 | Q0 | Q1 | Q2 | Q3 |
| 0 | 0 | Yes | 0 | 1 | 0 | 1 | 0 | 1 | 0 | 1 |
| 1 | 0 | Yes | 1 | 0 | 1 | 0 | 1 | 0 | 1 | 0 |
| 0 | 1 | No | 0 | 1 | 0 | 1 | 1 | 0 | 1 | 0 |
| 1 | 1 | No | 1 | 0 | 1 | 0 | 0 | 1 | 0 | 1 |

| DQ Input | | | | Burst LSB CA0 | Even Data Bit First | Default Mode | | | | Enable Match | TDQ Output | |
|---|---|---|---|---|---|---|---|---|---|---|---|---|
| Q0 | Q1 | Q2 | Q3 | | | DRe0 | DRo0 | DRe1 | DRo1 | | Pass | Fail |
| 0 | 0 | 0 | 0 | 0 | Yes | 0 | 0 | 0 | 0 | EM00 | 0 | 1 |
| 1 | 1 | 1 | 1 | 0 | Yes | 1 | 1 | 1 | 1 | EM11 | 1 | 0 |
| 0 | 0 | 0 | 0 | 1 | No | 0 | 0 | 0 | 0 | EM00 | 0 | 1 |
| 1 | 1 | 1 | 1 | 1 | No | 1 | 1 | 1 | 1 | EM11 | 1 | 0 |

| DQ Input | | | | Burst Address LSB (CA0) | Even Data Bit First | Invert Odd Bit (TINVO) | | | | Enable Match | TDQ Output | |
|---|---|---|---|---|---|---|---|---|---|---|---|---|
| Q0 | Q1 | Q2 | Q3 | | | DRe0 | DRo0 | DRe1 | DRo1 | | Pass | Fail |
| 0 | 1 | 0 | 1 | 0 | Yes | 0 | 1 | 0 | 1 | EM01 | 0 | 1 |
| 1 | 0 | 1 | 0 | 0 | Yes | 1 | 0 | 1 | 0 | EM10 | 1 | 0 |
| 1 | 0 | 1 | 0 | 1 | No | 0 | 1 | 0 | 1 | EM01 | 0 | 1 |
| 0 | 1 | 0 | 1 | 1 | No | 1 | 0 | 1 | 0 | EM10 | 1 | 0 |

FIG. 9A

| _____ X32 DQs _____ | | | | X16 DQs | | X8 DQs | | X4 DQs | |
|---|---|---|---|---|---|---|---|---|---|
| DQ | TDQ | DQ | TDQ | DQ | TDQ | DQ | TDQ | DQ | TDQ |
| 0 | 0 | 16 | 4 | 0 | 0 | 0 | 0 | 0 | 0 |
| 1 | 1 | 17 | 5 | 1 | 1 | 1 | 1 | 1 | 1 |
| 2 | 2 | 18 | 6 | 2 | 2 | 2 | 2 | 2 | 2 |
| 3 | 3 | 19 | 7 | 3 | 3 | 3 | 3 | 3 | 3 |
| 4 | 0 | 20 | 4 | 4 | 0 | 4 | 4 | | |
| 5 | 1 | 21 | 5 | 5 | 1 | 5 | 5 | | |
| 6 | 2 | 22 | 6 | 6 | 2 | 6 | 6 | | |
| 7 | 3 | 23 | 7 | 7 | 3 | 7 | 7 | | |
| 8 | 0 | 24 | 4 | 8 | 4 | | | | |
| 9 | 1 | 25 | 5 | 9 | 5 | | | | |
| 10 | 2 | 26 | 6 | 10 | 6 | | | | |
| 11 | 3 | 27 | 7 | 11 | 7 | | | | |
| 12 | 0 | 28 | 4 | 12 | 4 | | | | |
| 13 | 1 | 29 | 5 | 13 | 5 | | | | |
| 14 | 2 | 30 | 6 | 14 | 6 | | | | |
| 15 | 3 | 31 | 7 | 15 | 7 | | | | |

FIG. 9B

| DQ | TDQ | DQ | TDQ | DQ | TDQ |
|---|---|---|---|---|---|
| 0 | 0 | 16 | 4 | 0 | 0 |
| 1 | 0 | 17 | 4 | 1 | 0 |
| 2 | 1 | 18 | 5 | 2 | 1 |
| 3 | 1 | 19 | 5 | 3 | 1 |
| 4 | 0 | 20 | 6 | 4 | 2 |
| 5 | 0 | 21 | 6 | 5 | 2 |
| 6 | 1 | 22 | 7 | 6 | 3 |
| 7 | 1 | 23 | 7 | 7 | 3 |
| 8 | 2 | 24 | 4 | 8 | 4 |
| 9 | 2 | 25 | 4 | 9 | 5 |
| 10 | 3 | 26 | 5 | 10 | 6 |
| 11 | 3 | 27 | 5 | 11 | 7 |
| 12 | 2 | 28 | 6 | 12 | 4 |
| 13 | 2 | 29 | 6 | 13 | 5 |
| 14 | 3 | 30 | 7 | 14 | 6 |
| 15 | 3 | 31 | 7 | 15 | 7 |

ARCHITECTURE AND METHOD FOR TESTING OF AN INTEGRATED CIRCUIT DEVICE

CROSS-REFERENCE TO RELATED APPLICATION

The present application is a continuation-in-part of co-pending application Ser. No. 10/877,687, filed on Jun. 25, 2004, which is a continuation-in-part of U.S. Pat. No. 6,732, 304, filed on Sep. 21, 2000; a continuation-in-part of application Ser. No. 10/870,365, filed on Jun. 17, 2004, which is a continuation of U.S. Pat. No. 6,754,866, filed on Sep. 28, 2001; a continuation-in-part of application Ser. No. 11/108, 385, filed on Apr. 18, 2005, which is a continuation of U.S. Pat. No. 6,882,171, filed on Jun. 27, 2003, which is a continuation-in-part of U.S. Pat. No. 6,812,726, filed on Nov. 27, 2002; and a continuation-in-part of application Ser. No. 10/679,673, filed on Oct. 3, 2003; the entireties of which are incorporated by reference herein.

FIELD OF THE INVENTION

The current invention relates to the integrated circuits (IC) devices, and in particular, an architecture and method for testing of an integrated circuit device.

BACKGROUND OF THE INVENTION

A semiconductor or integrated circuit (IC) device may comprise many miniaturized circuits implemented in a semiconductor substrate. IC devices must be tested in order to ensure proper operation before they are used. IC devices can be tested in a limited fashion using built-in self test (BIST) circuitry that is implemented within the IC devices themselves. BIST testing however, is incomplete and does not test all aspects of operation. Thorough testing of an IC device is accomplished with complex external testing equipment. In order for complex test equipment to be used, many dedicated input/output (I/O) pins are typically required for allowing the test equipment to input various test patterns, codes, and data, and to stress the circuitry of the IC device. In an environment where multiple IC devices are combined within a single package (or module) having a limited number of input/output (I/O) leads, however, it can be difficult if not impossible to dedicate one or more I/O leads for testing of the IC devices. Furthermore, once the multiple IC devices are enclosed within a single package, it is difficult or impossible to monitor the signals which are communicated between the IC devices. In the case of system-on-chip (SoC), the various blocks, such as multiple processors and embedded memories, also benefit from accessibity to external testers.

SUMMARY OF THE INVENTION

The present invention provides, in various embodiments, system and methods for internally generating test data and addresses within an integrated circuit device for testing of the same. Internal generation of such patterns is beneficial, especially in the context of multiple chips placed into a single package with reduction in external pin count.

In accordance with an embodiment of the present invention, a system is provided comprising a first integrated circuit device, a second integrated circuit, and a testing component. The second integrated circuit device is implemented on a first monolithic die and connected to the first integrated circuit device. The first and second integrated circuit devices operate in conjunction in a normal operation. The testing component is implemented on a second monolithic die and operable to be connected between an external test machine and the second integrated circuit device for testing of the second integrated circuit in a test mode. The testing component allows the external test machine to test the second integrated circuit device in the test mode.

In accordance with another embodiment of the present invention, a system is provided comprising a first integrated circuit device implemented on a first monolithic die. A second integrated circuit device is implemented on a second monolithic die and connected to the first integrated circuit device. The first and second integrated circuit devices operate in conjunction in a normal operation. The testing component is operable to be connected between an external test machine and the second integrated circuit device for testing of the second integrated circuit in a test mode. The testing component allows the external test machine to test the second integrated circuit device in a test mode.

In accordance with yet another embodiment of the present invention, a testing component is provided for testing of a system comprising a first integrated circuit device connected to and operable to operate in conjunction with a second integrated circuit device. The first integrated circuit device is implemented on a first monolithic die, and the second integrated circuit device is implemented on a second monolithic die. The testing component comprises circuitry for receiving bits of test data from an external test machine at a first frequency; circuitry for generating a string of bits for each bit of test data from the external test machine; and circuitry for providing the generated bit strings to the second integrated circuit device at a second frequency, wherein the second frequency is higher than the first frequency Important technical advantages of the present invention are readily apparent to one skilled in the art from the following figures, descriptions, and claims.

BRIEF DESCRIPTION OF THE DRAWINGS

For more complete understanding of the present invention and for further features and advantages, reference is now made to the following description taken in conjunction with accompanying drawings, in which:

FIGS. 3A and 3B are tables for exemplary test mode codes, according to an embodiment of the present invention.

FIG. 7B FIGS. 8A and 8B are tables for exemplary data read patterns, according to an embodiment of the present invention. Use new FIGS. 8A and 8B FIGS. 9A and 9B are tables for exemplary mapping of data signals to test data signals, according to an embodiment of the present invention.

FIG. 10 is an exemplary timing diagram of a sequence for programming repair, according to an embodiment of the invention.

DETAILED DESCRIPTION OF THE PREFERRED EMBODIMENTS

Figure 1A:
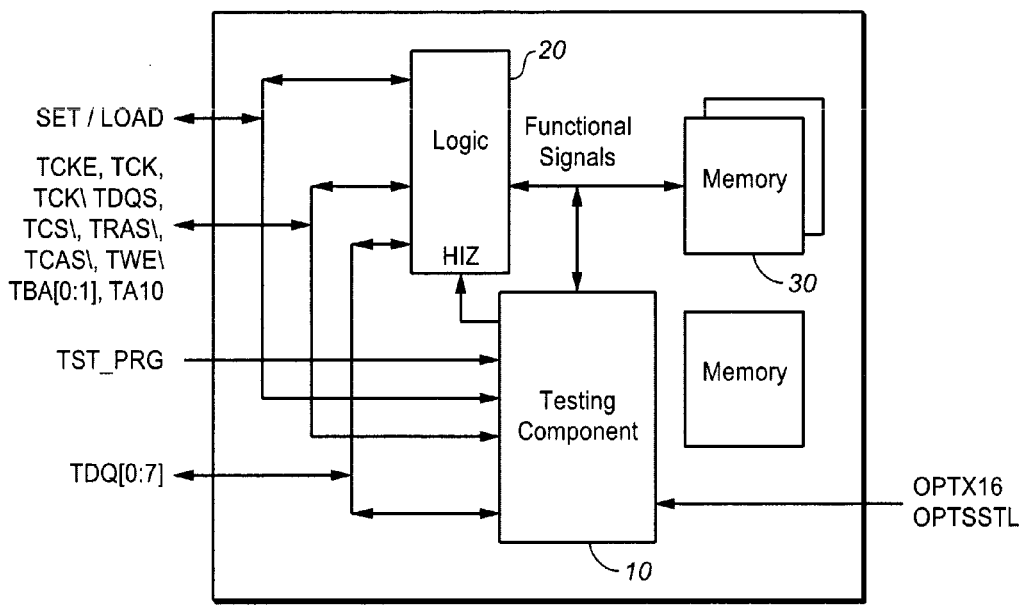
FIGS. 1A through 1J are block diagrams of exemplary architectures in which embodiments of the present invention may be incorporated and used.

The preferred embodiments of the present invention and their advantages are best understood by referring to FIGS. 1A through 16 of the drawings. Like numerals are used for like and corresponding parts of the various drawings.

In one embodiment, the present invention provides a platform of hardware and/or software that enables the complete access and reliable testing of multiple integrated circuit (IC) devices within a package. This platform may include a testing component (e.g., test circuits, test pads, shared pads, etc.), one or more probe cards and related hardware, wafer probe programs, load board and related hardware of external test equipment, and software and routines for final test programs.

The testing component, in various embodiments, may comprise or specify pad coordinates for complete wafer and package testing; one or more digital test pads (e.g., for TEST, SET, LOAD, TDQ[0:7], or other test command inputs); one or more analog test pads; separate test IO voltage capability (e.g., VDQT pads); test input command multiplex circuitry; test mode entry and programming sequence; address pattern generator; and address/data scramble circuits.

Features of various embodiments may include input/output pads, buffers, or leads which are shared by the testing component and other devices (e.g., ASIC); multiple states of testing, such as test mode entry, programming, and access; internal generation of addresses for testing; read and write data paths for testing which implement data expansion and compression schemes; ability to monitor the interface between two IC devices (i.e., chip-to-chip interface monitoring); and bond pad layout or sequence which has been optimized. Advantages of some embodiments include increasing the manufacturability and reducing the cost of multiple IC devices within a single chip, package, or module.

FIGS. 1A through 1J are block diagrams of exemplary architectures in which embodiments of the present invention may be incorporated and used. Referring to the architecture of FIG. 1A, a testing component 10 can be used to enhance testing of a first integrated circuit (IC) device 20 and/or one or more second IC devices 30. First and second IC devices 20 and 30 represent any type of IC devices that may be used together and require testing, such as, for example, by external automated test equipment or an integrated circuit tester.

First and second IC devices 20 and 30 can be implemented in the same semiconductor die (commonly referred to as a "chip") or separate dies. A die is a monolithic structure formed from, for example, silicon or other suitable semiconductor material. IC devices 20 and 30 can be packaged together or separately in suitable packaging, such as, for example, as a standard ball grid array (BGA) or thin quad flatpack (TQFP) having 144 pins or more. However, other types of packaging may be used. For example, the packaging may have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

In one embodiment, first and second IC devices 20 and 30 may be dies mounted in a side-by-side or stacked arrangement in a multi-chip package (MCP) or multi-chip module (MCM). In such embodiment, the IC devices 20 and 30 may share one or more input/output (I/O) pins, balls, or other suitable external leads or connectors.

In another embodiment, IC devices 20 and 30 may be separately packaged and placed together in a package-in-package (PIP) system or on a printed circuit board (PCB). First and second IC devices 20 and 30 may connected through one or more bond pads, bonding wires, traces, etc. to provide communication between the devices and/or other components within or external thereto. As used herein, the terms "connected," "coupled," or any variant thereof, means any connection or coupling, either direct or indirect, between two or more elements. In another embodiment, first IC device 20 and testing component 10 are on the same die. Second IC device 30 is on a separate die. In this case, testing component 10 and first IC device 20 share the same pad within the same die. Yet, in another embodiment, all of testing component 10, first IC device 20, and second IC device 30 are on the same die (system on chip or SoC).

Referring to FIG. 1A, in this example, first IC device 20 is illustrated as a logic device and second IC device 30 is illustrated as a memory device. As a logic device, first IC device 20 can be a chip with logic circuitry, such as, for example, an application specific integrated circuit (ASIC), a processor, a microprocessor, a microcontroller, a field programmable gate array (FPGA), programmable logic device (PLD), complex programmable logic device (CPLD), or other logic device. As a memory device, second IC device 30 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory, or other memory device operating under any suitable format or protocol, such as double-data rate (DDR) or DDR2. The memory device can be configured in various configurations (e.g., X32, X16, X8, or X4) and may comprise a plurality of memory cells arranged, for example, in rows and columns. The memory cells can be implemented using transistors, capacitors, programmable fuses, etc.

Testing component 10 facilitates, supports, or enhances the testing of first and/or second IC devices 20 and 30. In one embodiment, testing component 10 may comprise circuitry for interfacing with test equipment, circuitry for interfacing with one or both of first and second IC devices 20 and 30, and logic for supporting testing.

In one embodiment, testing component 10 can be integrated in or implemented on the same die as one or both of first and second IC devices 20 and 30. This could be, for example, testing component 10 integrated inside an ASIC with embedded memory or, for example, testing component 10 integrated inside an ASIC on one die with memory on a separate die contained in the same package (i.e., system-in-package (SiP)). In another embodiment, testing component 10 can be implemented in a die separate from the first and second IC devices 20 and 30, and contained within the same package (MCP or MCM) or a separate package. In still another embodiment, testing component 10 can be part of an external test machine for testing one or both of first and second IC devices 20 and 30; for example, testing component 10 can be placed on a load board of the external test machine.

In FIG. 1A, testing component 10, logic device 20, and memory device 30 are contained within a single module. This module can be a system-in-package (SiP), package-in-package (PiP), or system-on-chip (SoC). It also can be a combination of SoC, SiP and PiP. As shown, testing component 10 may share one or more I/O pads, pins, leads, or buffers of the module with logic device 20. This can reduce pin count for the module.

The components of the module—testing component 10, logic device 20, and memory device 30—can work in normal operation or be placed in test mode.

In normal operation, first and second IC devices 20 and 30 may work in conjunction to receive, process, store, and output data and information. Second IC (memory) device 30 provides storage capability for data/information that is provided from first IC (logic) device 20 or some other components. Logic device 20 provides processing capability for operating on data/information, and may retrieve information from and store information into memory device 30. In normal operation, functional signals for data/address/control may be conveyed between memory device 30 and logic device 20. More specifically, logic device 20 drives the functional pads of memory device 30 using the functional signals. For logic and memory devices, these functional signals can be, for example, clock (CK), clock bar (CK\), clock enable (CKE), chip select (CS), row address strobe (RAS\), column address strobe (CAS\), write enable (WE\), bank select (BA[0:1]), address (A), and data (DQ).

In test mode, testing component 10 may be used in functionally testing one or both of first and second IC devices 20 and 30 to verify proper operation. There can be two phases of test mode: a programming phase (ITMP) and an access phase (ITMA). In the programming phase, the testing component 10 can be set up for testing, for example, by loading or programming test addresses and sequential test data pattern (or codes). In the access phase, one or both of IC devices 20 and 30 are actually operated using the test address and test patterns from the testing component 10. In one embodiment, the module can enter access phase while remaining in the programming phase. That is, while in access phase, new test modes can be still set or programmed. For example, memory device 30 may be in pre-charge condition while programming in on-going; after new test modes are set or programmed, the memory device 30 can be re-tested. In some embodiments, during test mode the logic device 20 and memory device 30 are operated normally, and testing component 10 can be used to monitor and "read" the signaling at the interface of the devices 20 and 30.

Testing component 10 may allow an external test machine to have control of and test one or both of the IC devices 20 and 30. For this purpose, in one embodiment, testing component 10 and IC device 20 may send and receive signals to and from external test equipment. In one embodiment, the external test equipment may set test modes and load test vectors and test patterns into testing component 10 to allow for on-chip address and data pattern generation that can be used to test one or both IC devices 20 and 30. Testing component 10 may allow or support thorough testing of IC device 20 or 30 with external test equipment that operates at a speed or frequency which is lower than the normal operating frequency of one or both IC devices 20 and 30.

Testing component 10 may receive, generate, or output a number of signals for testing of IC device 20 or 30. In one embodiment, these signals may be categorized as follows: (1) test mode entry signal, (2) test functional signals, (3) programming signals, (4) test I/O signals, and (5) test and repair signals.

The test mode entry signal, TEST, places the module (including one or all of testing component 10, logic device 20, and memory device 30) into test mode. The test mode entry signal can be active high. The test mode entry signal can be driven from the logic device 20, or bonded out to a dedicated pin/ball. The former allows the use of a standard memory tester to access the memory device 30 via the testing component 10 without adding any additional pins/balls to the package. In one embodiment, the TEST signal can be generated by the logic device 20 using software and registers or driven through the pads of the logic device 20. In another embodiment, a dedicated pin may be provided for the TEST signal, which requires one additional pin if all the "no connect" pins are otherwise used up for the logic device 20. The shared pads allow access to the testing component 10 without additional pins/balls to the package (or pads in the case of the SoC). In some embodiments, the test mode entry signal may be used to tri-state the output drivers of logic device 20 that share the same pins, balls, or leads with the testing component 10.

The test functional signals correspond, and map one-to-one, to the functional signals communicated between the logic device 20 and memory device 30. Thus, for example, the functional signals may include test clock (TCK), test clock bar (TCK\), test clock enable (TCKE), test chip select (TCS\), test row address strobe (TRAS\), test column address strobe (TCAS\), test write enable (TWE\), test bank select (TBA[0:1]), test address (TA), and test data (TDQ). The test functional signals can share pins/balls with the functional signals of logic device 20. The test functional signals are used to drive the functional pads of the memory device 30 during testing.

The programming signals, SET and LOAD, are used in conjunction with the test I/O signals to set test modes and load vectors during the programming phase of test mode. The programming signals may program the testing component 10 to support specific tests for memory device 30.

In the programming phase (ITMP) of test mode, testing component 10 is set up or programmed for testing. In one embodiment, one or more test I/O signals (e.g., test data (TDQ) signals) may be used to program test modes, load test addresses, load test vectors, and load test patterns. The SET and LOAD signals can be used to enable test addresses or vectors to be set and loaded. With some embodiments, test mode programming can be performed asynchronously (i.e., no clock is required); in other embodiments or as an option, programming can be synchronous. In one embodiment, a test control (TCNT) is set to a high value ("1") to exit the programming phase and enter the access phase. In the access phase (ITMA) of test mode, the memory device 30 is actually operated using the test addresses and test patterns. The test I/O signals are used to read and write compressed data to and from memory device 30. During access phase, the memory device 30 may operate synchronously or asynchronously, depending on the memory specification. In the interface monitoring aspect, certain signals at the interface between logic device 20 and memory device 30 may be selected and output from the module, for example, through the test I/O signals (e.g., TDQ signals) at testing component 10.

The test and repair signals may include programming repair signal, TST_PRG. The programming repair signal can be used for high-voltage anti-fuse programming. In one embodiment, this TST_PRG signal is active high and can be bonded out to a dedicated pin/ball.

A HIZ signal may be output from the testing component 10 to logic device 20 to tri-state that device's output drivers on the balls/pins that logic device 20 shares with testing component 10, as well as the memory interface signals (functional signals). In one embodiment, the HIZ signal is active high when the TST_PRG signal is asserted.

Figures 8A, 8B, 10:
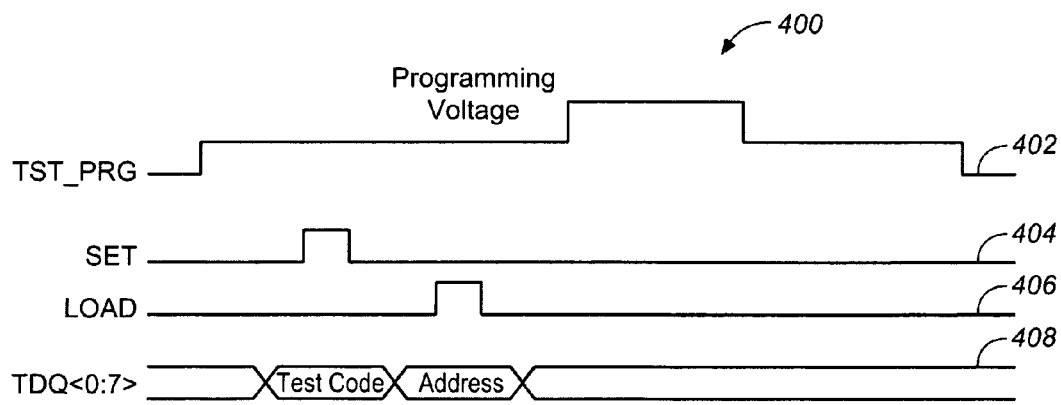

In normal operation for the logic device 20 and memory device 30, the logic device 20 communicates directly with the memory device 30 via the functional signals; the test functional signals of testing component 10 are tri-stated. During test mode, the functional signals from logic device are tri-stated, thus allowing the testing component 10 to take control of the memory device 30. After functional testing, the memory device 30 can be repaired using the TST_PRG signals. The SET and LOAD signals are used to enable the repair mode and select fuses (or anti-fuses). In particular, the SET signal plus a test code are used to enable the repair mode. The LOAD signal plus an address code are used to select which fuse (or anti-fuse) to program. Once the address of the fuse is selected, the TST_PRG signal may be brought to the programming voltage (e.g., 2× or 2.5× the supply voltage);, such as shown in FIG. 10. The fuse programming typically occurs during test mode; i.e. TST_PRG (or TEST) is at VDD. To program a fuse, TST_PRG (or TEST) is brought to VDD plus VPRG (where VPRG is the additional voltage required to program the fuse, or antifuse.

In one embodiment, the TST_PRG signal uses the same pad as the TEST signal. In other words, the TEST pad is re-defined as a anti-fuse programming pad, so that an extra pad is not required. In other embodiments, other pads, such as a programming pad (e.g., TA10 or TCS) can be redefined and used for the TST_PRG signal. Furthermore, in another embodiment, a dedicated programming pad (PRG) can be provided for the TST_PRG signal.

Figure 1B:
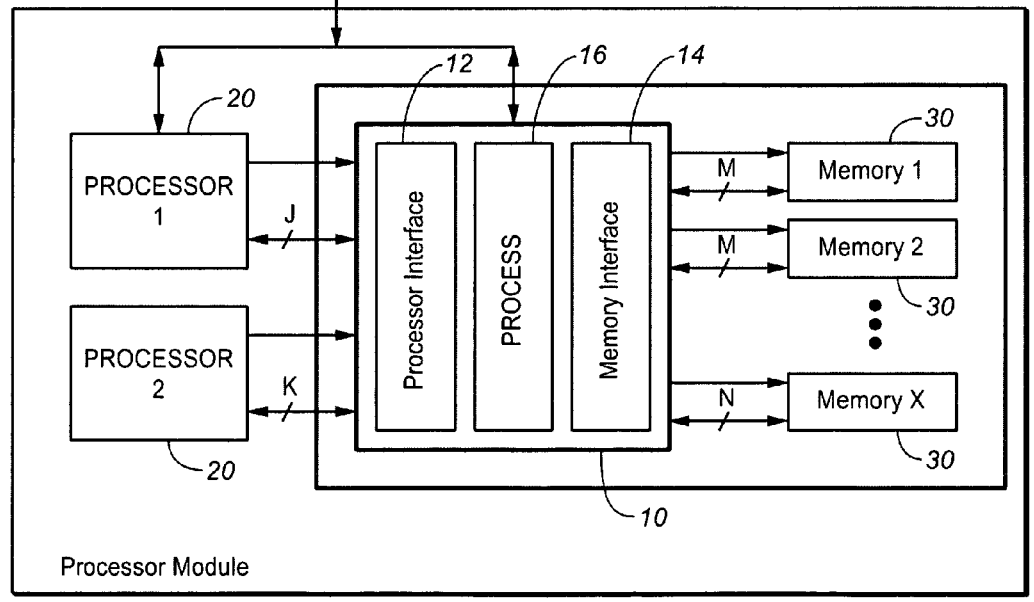
Figure 1C:
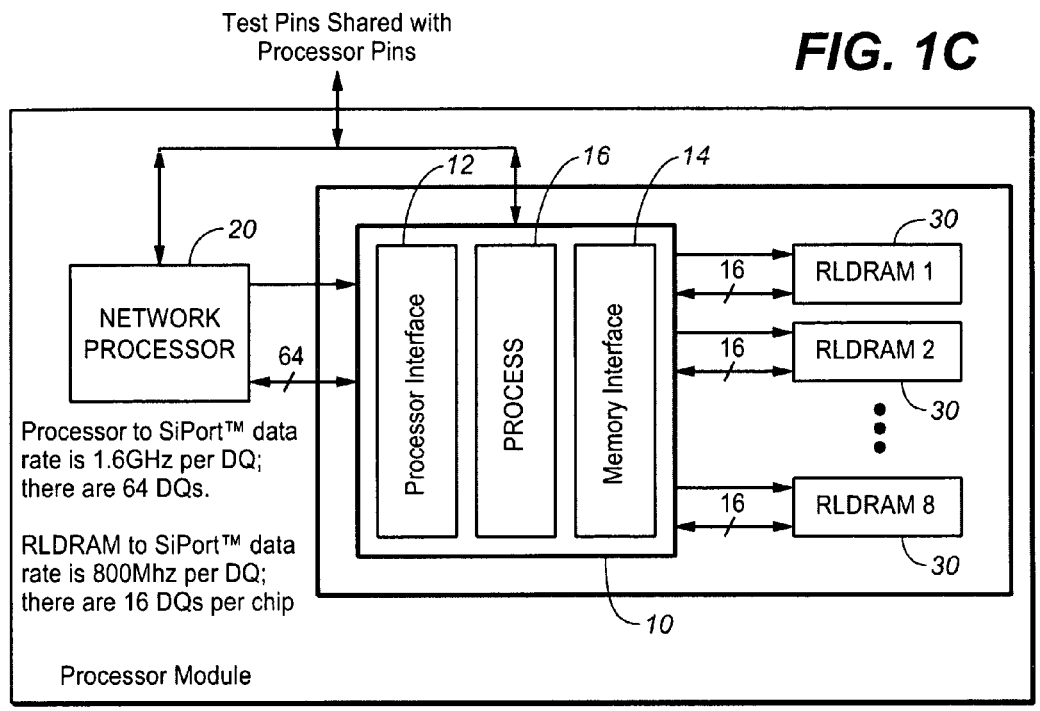

FIGS. 1B and 1C are exemplary architecture in which testing component 10 can be incorporated in the same package or module as a plurality of memory devices 30, which can be of the same type (e.g., RLDRAM). This package or module can be in communication with a plurality of processors or logic devices 20 (FIG. 1B) or a single logic device (FIG. 1C), contained within a larger processor module. As shown in FIGS. 1B and 1C, testing component 10 may comprise a processor interface 12 for communicating with the logic device(s) 20, a memory interface 14 for communicating with the memory device(s) 30, and a process block 16 for processing of signals received from the logic and/or memory devices during testing.

Figure 1D:
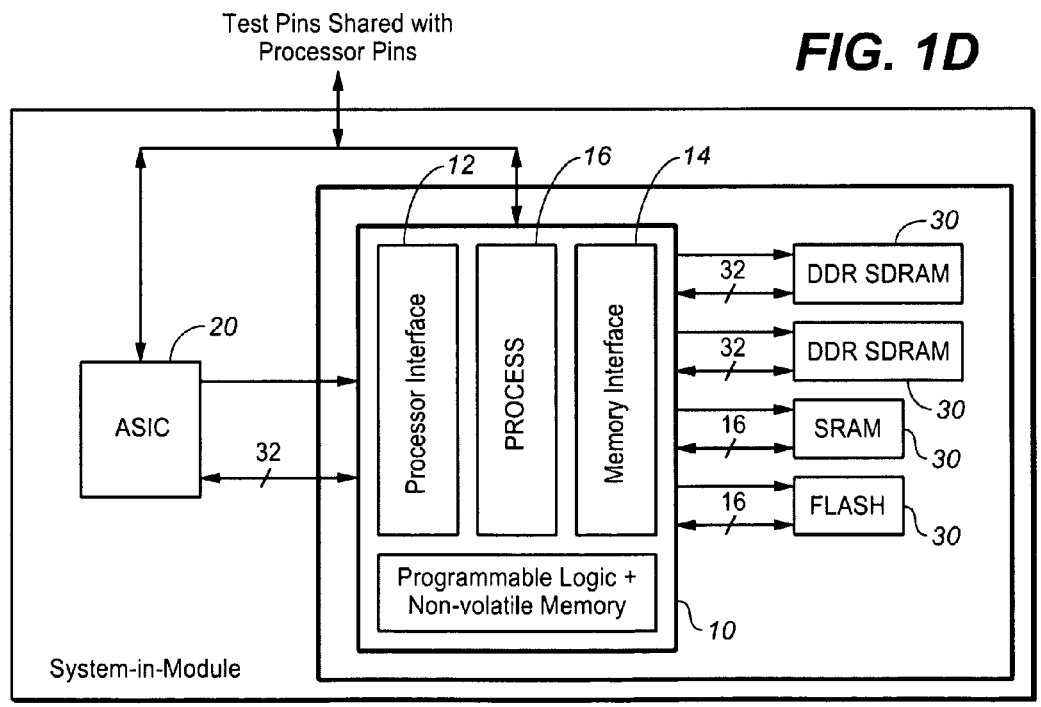

FIG. 1D is an exemplary architecture in which testing component 10 can be incorporated in the same package or module as a plurality of memory devices 30, which can be of different types (e.g., DDR SDRAM, SRAM, FLASH memory). This package or module can be in communication with a logic device 20 (e.g., ASIC), both of which can be contained in a larger system-in-module.

Figure 1E:
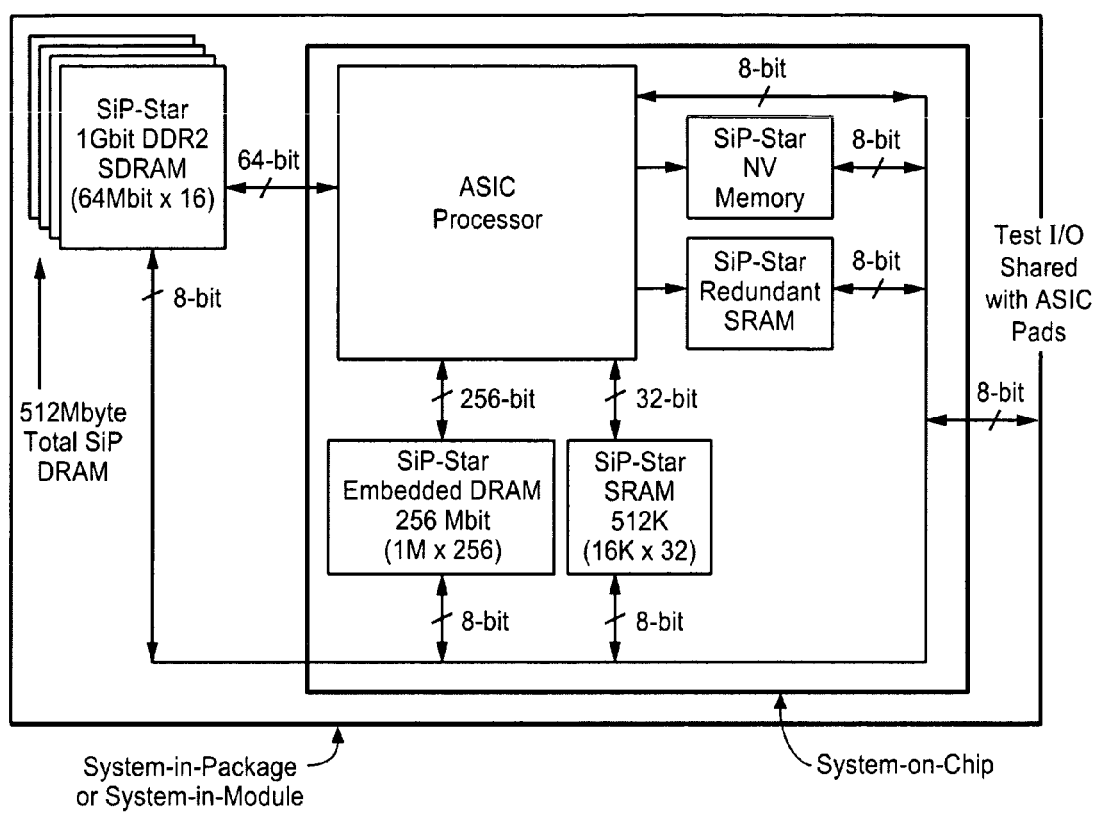

FIG. 1E is an exemplary architecture in which testing component 10 may be incorporated into embedded DRAM (eDRAM), SRAM, OTP ROM, or other module which is contained in a system-on-chip (SoC) along with logic device 20 (e.g., ASIC), and in communication with one or more other memory devices in a system-in-package or system-in-module. The SoC may contain the ASIC, eDRAM, SRAM, OTP memory, etc. which is packaged along with multiple DRAMs inside an SiP. In one embodiment, non-volatile memory (e.g., redundant SRAM block) on the SoC can be used (1) to substitute for bad or faulty elements in the DRAM (by storing bad address information and matching the incoming address from the memory controller; this also allows for isolating bad memory sectors); (2) for chip identification (chip ID) and information; and (3) for re-configuration of memory address or data input/output (I/O).

Various I/O pads on the first IC device 20 may be shared for use in both normal operation and in test mode. With shared I/O pads, the first IC device (e.g., ASIC) is used as a routing vehicle to access the second IC device (e.g., DRAM), for example, in a SiP (system-in-package) or SiM (system-in-module). The concept is the same for embedded DRAM (SoC) except that the SDRAM I/O buffers and pads are not necessary.

Figure 1F:
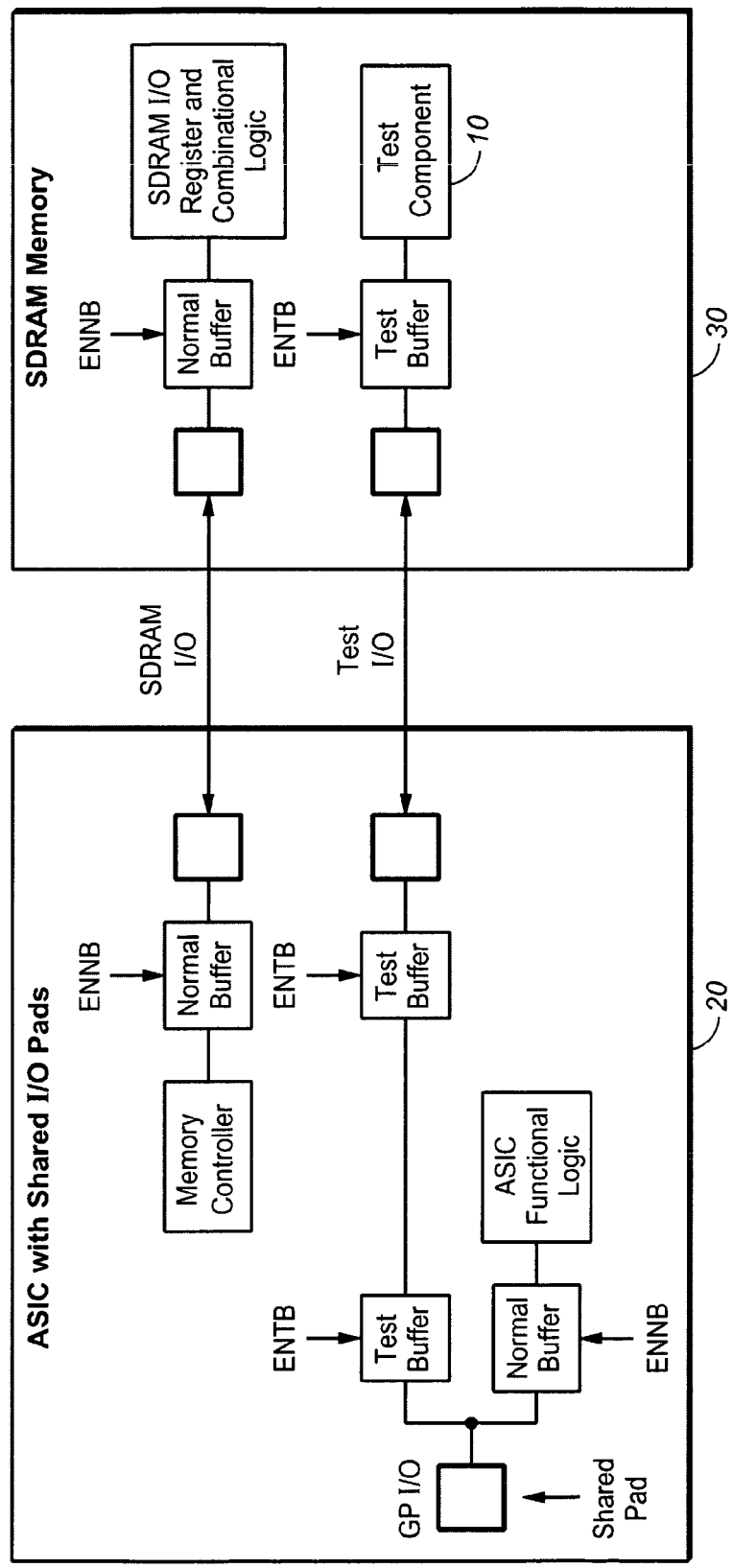

FIG. 1F is an exemplary architecture in which testing component 10 can be incorporated in the same die or package as a memory device 30, in particular, a SDRAM memory. In this embodiment, logic device 20 (e.g., an ASIC) may comprise a I/O pad (e.g., GP I/O) which is shared for signals to and from the memory device 20. The memory device 20 may have dedicated test pads (e.g., Test I/O).

Test and Normal I/O buffers connected to the shared pad are enabled by ENTB (enable test buffer) and ENNB (enable normal buffer), respectively. Test I/O buffers duplicate and are identical to the normal I/O buffers. The duplicate set of I/O buffers allows complete coverage of the logic chain in the memory device 30. The normal I/O buffer is used in normal operation, when logic device 20 and memory device 30 are working in conjunction. The test I/O buffers are used in test mode. The normal I/O buffers are not exercised during test mode, but since they are designed and laid out to be identical in every way to the normal buffers, it is expected that the normal I/O buffers will work under the same test conditions.

Figure 1G:
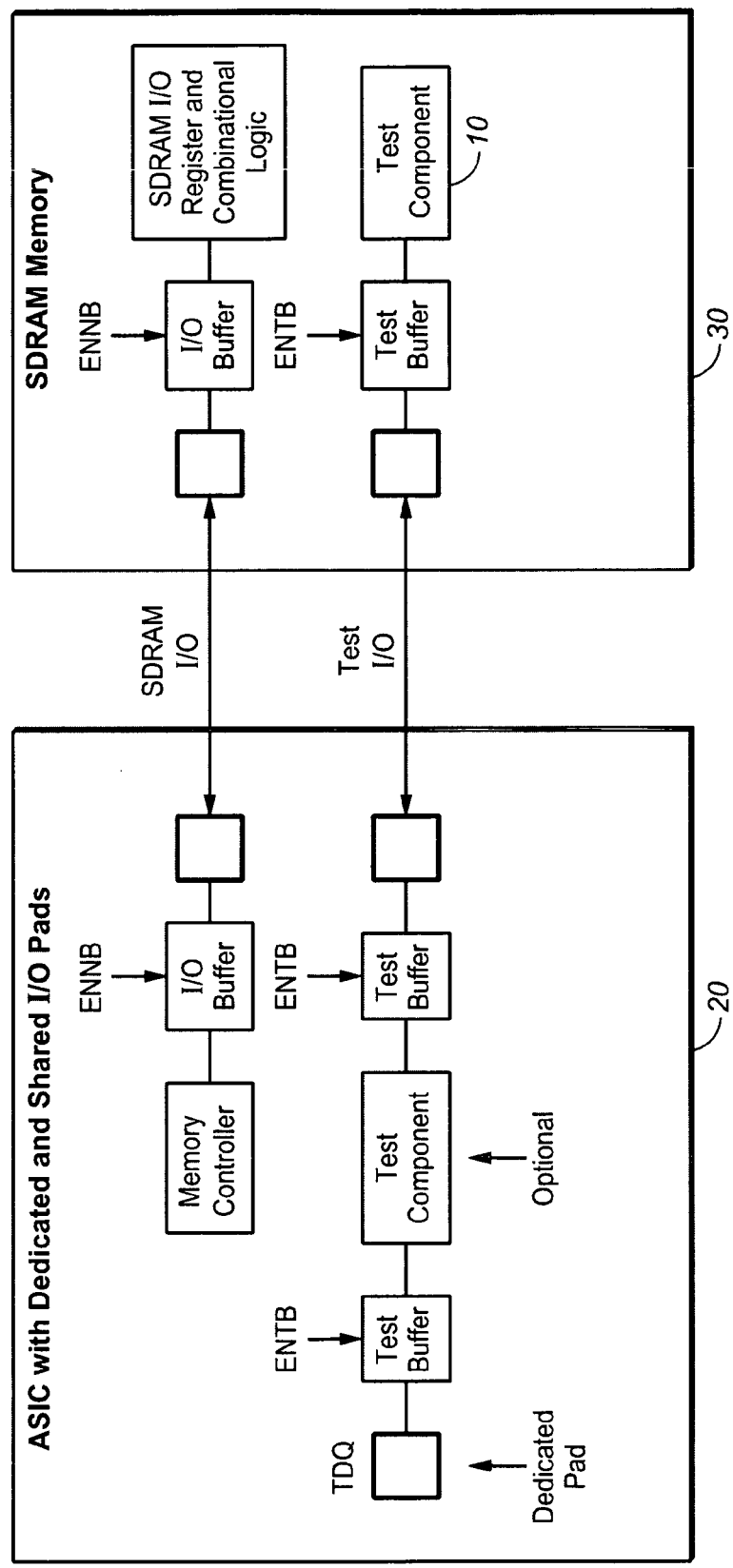

FIG. 1G is an exemplary architecture in which testing component 10 can be incorporated partly in a logic device 20 (e.g., ASIC) and partly in memory device 30 (e.g., SDRAM). The logic device 20 and memory device 30 can be implemented in separate dies or in separate packages. Logic device 20 may comprise a I/O pad (e.g., TDQ) which is dedicated for connection to the memory device 20. The memory device 20 may have dedicated test pads (e.g., Test I/O).

Figure 1H:
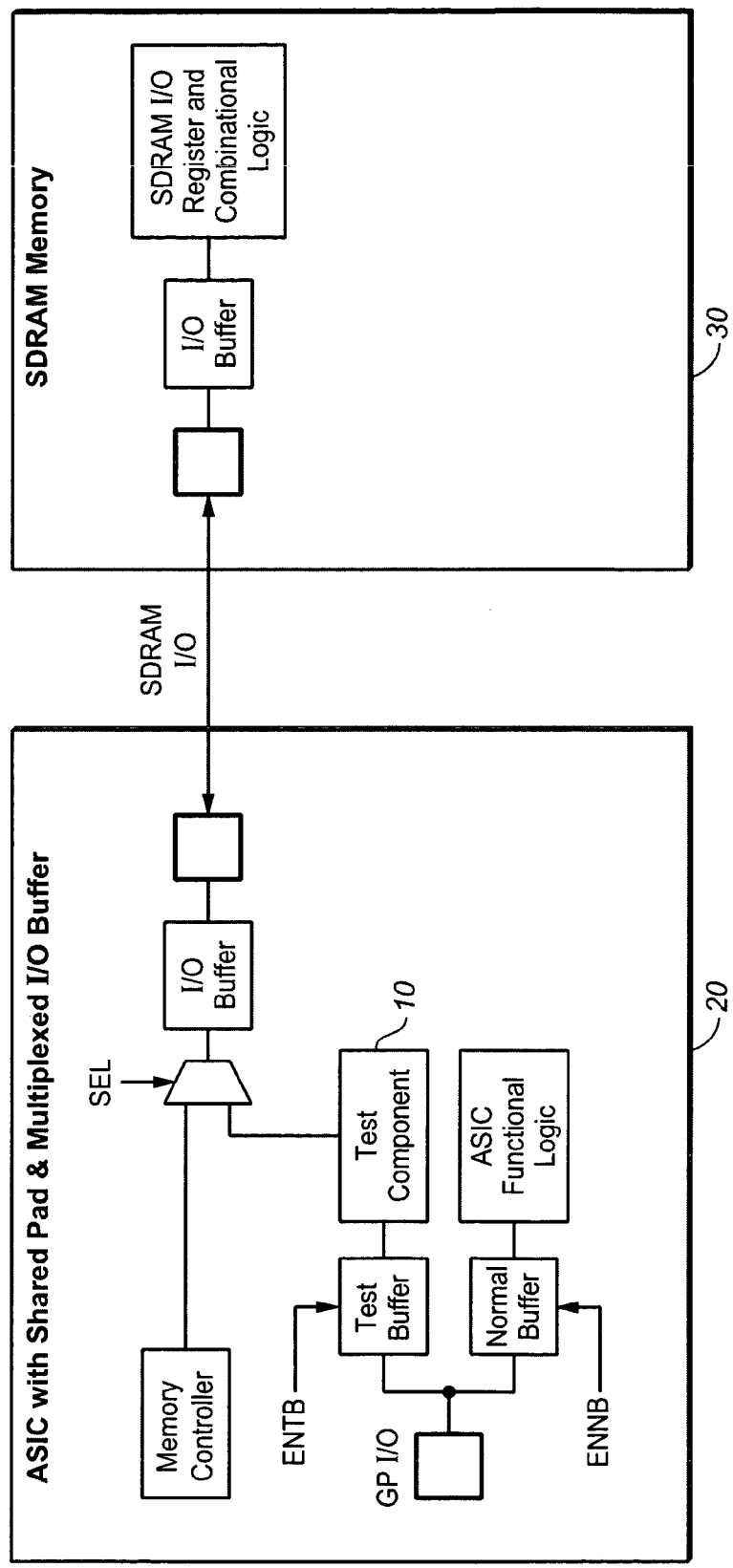

FIG. 1H is an exemplary architecture in which testing component 10 can be incorporated in the same die or package as a logic device 20 (e.g., an ASIC). In this embodiment, logic device 20 (e.g., an ASIC) may comprise a I/O pad (e.g., GP I/O) which is shared for signals to and from the memory device 20. Test and Normal I/O buffers connected to the shared pad are enabled by ENTB (enable test buffer) and ENNB (enable normal buffer), respectively. The logic device 20 may include a multiplexer (enabled with SEL signal) for multiplexing between external signals and signals generated by the logic device 20.

Figure 1I:
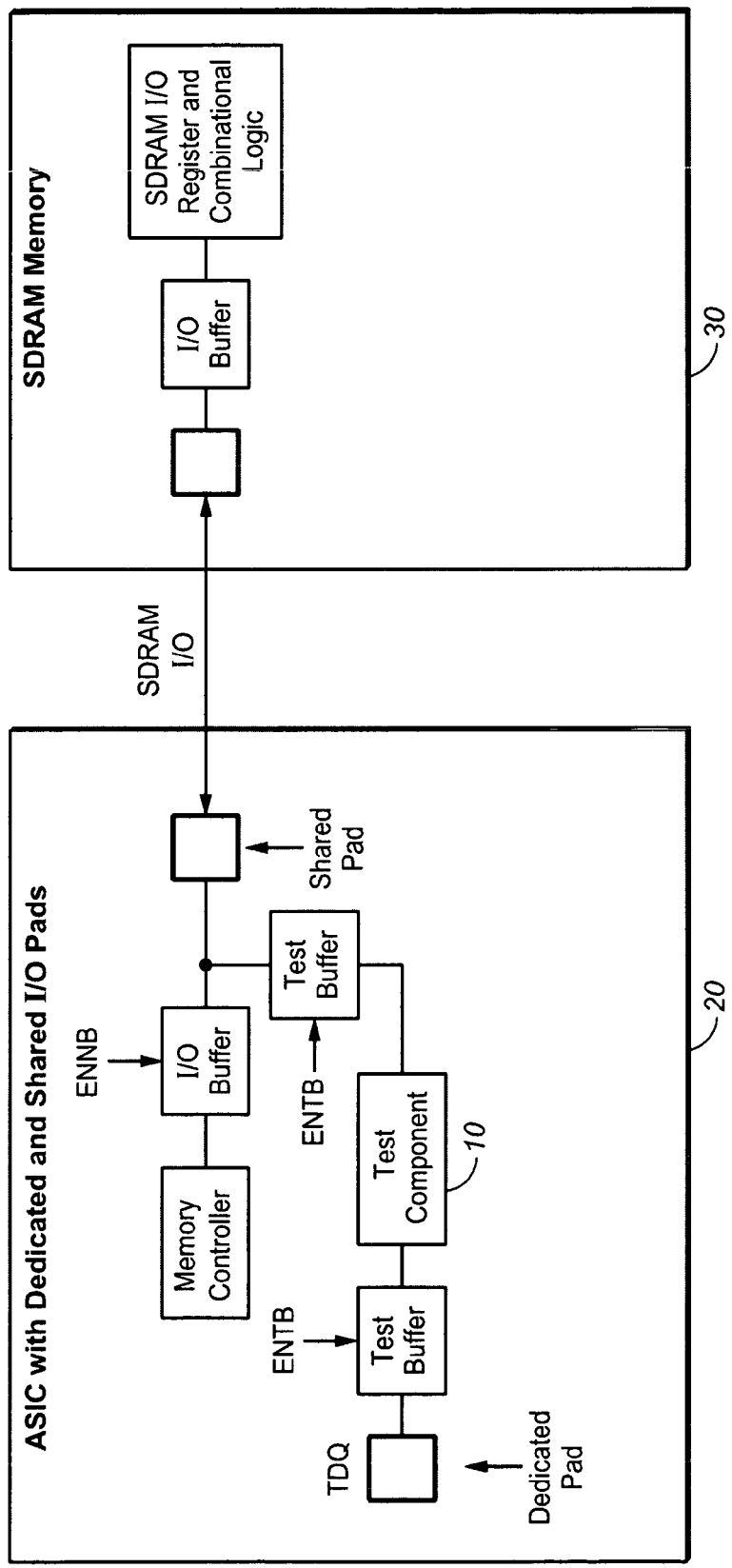

FIG. 1I is an exemplary architecture in which testing component 10 can be incorporated in the same die or package as a logic device 20 (e.g., an ASIC). Memory device 20 (e.g., SDRAM) can be implemented in a separate die or in separate package. In this embodiment, logic device 20 (e.g., an ASIC) may comprise a I/O pad (e.g., GP I/O) which is shared for signals to and from the memory device 20. Test and Normal I/O buffers connected to the shared pad are enabled by ENTB (enable test buffer) and ENNB (enable normal buffer), respectively. The memory device 30 may have I/O pads which are shared.

Figure 1J:
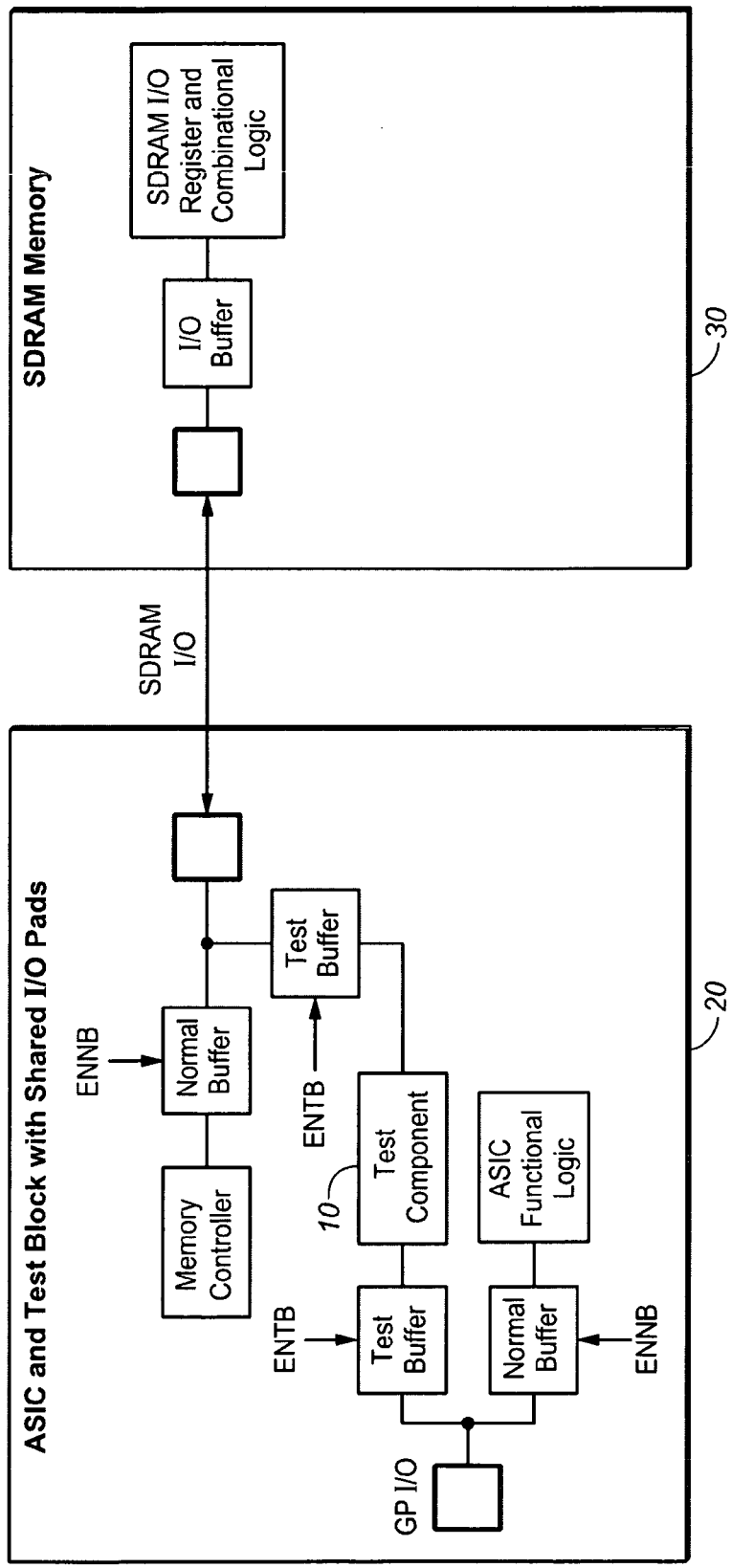

FIG. 1J is an exemplary architecture in which testing component 10 can be incorporated in the same die or package as a logic device 20 (e.g., an ASIC). Memory device 20 (e.g., SDRAM) can be implemented in a separate die or in separate package. In this embodiment, logic device 20 (e.g., an ASIC) may comprise a I/O pad (e.g., GP I/O) which is dedicated for signals to and from the memory device 20. Other pads on the logic device 20 are shared for signals to and from the memory device 30. Test and normal I/O buffers connected to the shared pad are enabled by ENTB (enable test buffer) and ENNB (enable normal buffer), respectively. The memory device 30 may have I/O pads which are shared.

In various embodiments, the number of shared I/Os (GP I/Os in general, but can be address or command input pads, etc.) used to connect to the external tester is less than the interface for the memory device 30. This is because of the address generation scheme, the parallel I/O compression scheme, the programming and accessing scheme of the testing component 10, as described herein.

Figure 2:
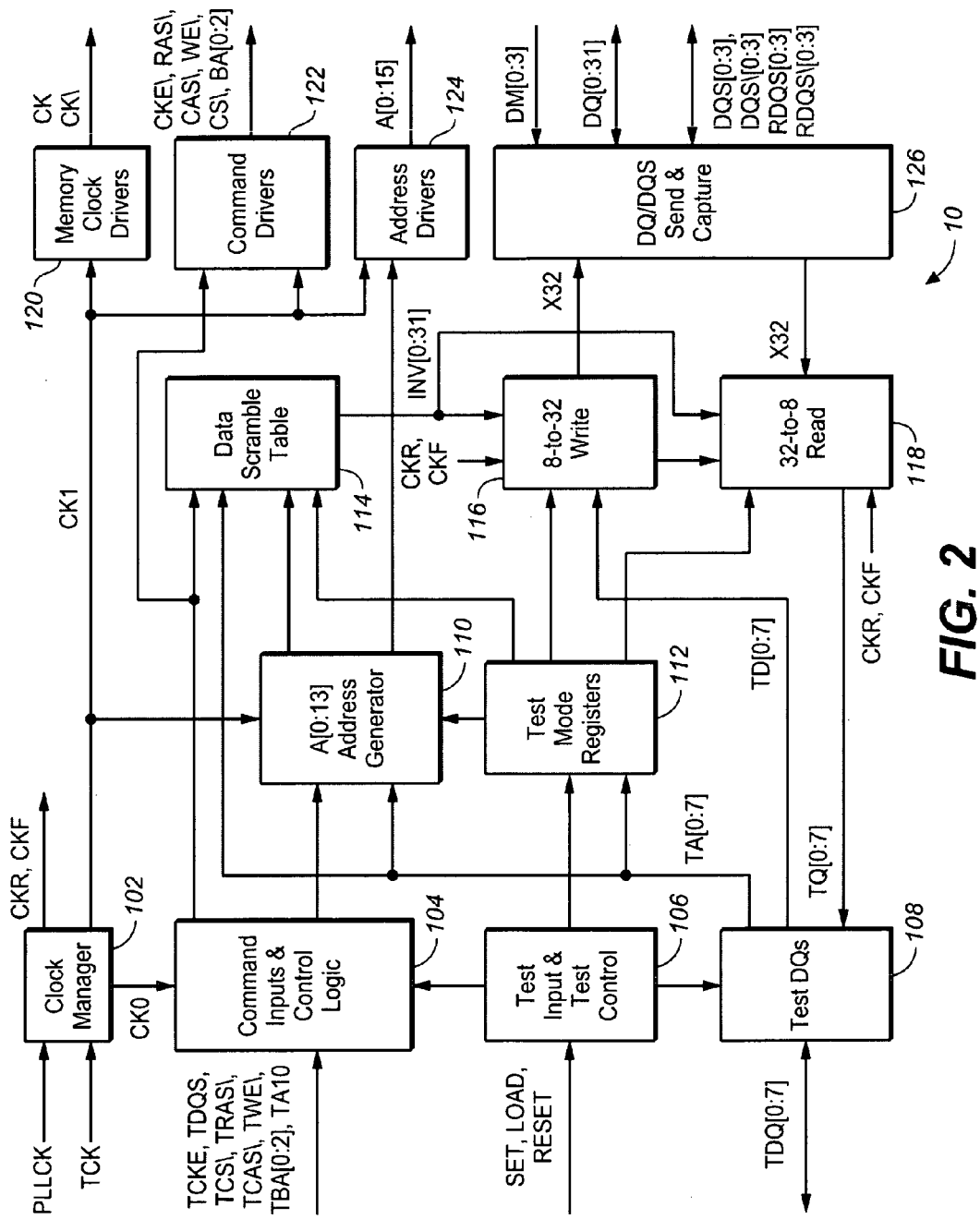
FIG. 2 is a block diagram of an exemplary implementation for a testing component, according to an embodiment of the present invention.

FIG. 2 is a block diagram of an exemplary implementation for a testing component 10, according to an embodiment of the present invention. As described herein, testing component 10 facilitates, supports, or enhances the testing of one or more IC devices which may, for example, be contained in the same or separate package or module. In this implementation, testing component 10 includes a clock manager block 102, command input and control logic block 104, test input and test control block 106, test data block 108, address generator block 110, test mode register block 112, data scramble table block 114, write expansion block 116, read compression block 118, memory clock driver block 120, command driver block 122, address driver block 124, and data send and capture block 126.

The clock manager block 102 receives a test clock TCK signal from, for example, an external test machine. The clock manager block 102 may also receive a phase lock loop clock (PLLCK) signal. In response to the TCK and/or PLLCK signals, the clock manager block 102 generates one or more other clock signals (e.g., CK0, CK, CK\), some of which may have a frequency that is higher than the received test clock TCK signal. As such, testing component 20 supports testing of IC devices which operate at frequencies higher than the frequency of some external test machines. This allows IC devices to be thoroughly tested, for example, using older test equipment. The clock signals output from clock manager block 102 may be provided to other blocks in testing component 10 or to the IC device to be tested (via memory clock driver 120).

Command input and control logic block 104 receives various test functional signals (e.g., TCKE, TDQS, TCS\, TRAS\, TCAS\, TWE\, TBA[0:2], TA10), and processes or forwards these functional signals to other blocks in testing component 10 for generating suitable command and address signals for testing of an IC device. These command signals include, for example, CKE, CS, RAS\, CAS\, WE\, BA[0:2] which can be input to memory device 30 via command driver block 122. The address signals include, for example, A[0:15], which are input to memory device 30 via address driver block 124.

In another embodiment, the test functional signals received by command input and control logic block 104 can include SET, LOAD, and CMD (instead of TCS\, TRAS\, TCAS\. TWE\, etc.). A 4-bit wide stream can be registered using CMD pin as the input data source and the SET signal to register. For example, an Activate Row command can be a series of four serial bit stream b0011, a Read command can be b0101, and so on. The serial bit can be registered on the positive edge of TCK signal when the SET signal is high. In one embodiment, four registers and a 2-bit counter can be used to accept the CMD input.

Test input and test control block 106 receives the TEST, SET, and LOAD signals for placing the module into test mode, program test modes (or phases), and load or enable test addresses, test vectors, and test patterns. Test input and test control block 106 provides one or more output signals to test mode register block 112, which functions store or forward the test codes, vectors, patterns, etc. for further processing or use as appropriate.

Test data block 108 is an input/output component which receives and outputs test data signals (TDQ[0:7]) from and to external test equipment. Test data signals which are received from external test equipment are processed or forwarded to other blocks of testing component 10 (e.g., data scramble table block 114 and write expansion block 116) to generate data signals (DQ[0:31]), which are then provided to memory device 30 via data send and capture block 126. The test data signals which test data block 108 outputs to external test equipment carry the results from testing of memory device 30. These test data signals may be received from read compression component 118 in the form of signals TQ[0:7].

Address generator block 110 receives signals from the clock manager block 102, command input and control logic block 104, and test data block 108. Using the received information, address generator block 110 generates address signals (A[0:15]) for use in testing memory device 30. In one embodiment, address generator block 110 may comprise a sequence pattern generator, such as that described in related U.S. application Ser. No. 10/205,883 entitled "Internally Generating Patterns For Testing In An Integrated Circuit Device," filed on Jul. 25, 2002, and related U.S. application Ser. No. 11/083,473 entitled "Internally Generating Patterns For Testing In An Integrated Circuit Device," filed on Mar. 18, 2005, both of which are assigned to the same assignee and incorporated by reference herein in their entirety. Such pattern generator may comprise a test column address counter and a test row address counter. The test column address counter may increment independently of the test row address counter. The address counters may function to internally generate sequences of numbers for use as addresses during testing.

Data scramble table block 114 receives signals from command input and control logic block 104, test data block 108, address generator block 110, and test mode register block 112. Data scramble table block 114 functions to generate signals INV[0:3 1] which are provided to write expansion block 116 and read compression block 118. Data scramble table block may store a data scramble table or code, and can be implemented as non-volatile memory (e.g., EEPROM or flash memory). In one embodiment, the data scramble table or code can be separate from the testing component 10. In this case, the memory for the data scramble table may be on the same die (SoC) or separate die/package (SiP/PiP). One data scramble table (implemented on separate non-volatile memory) can service multiple testing components 10.

Write expansion block 116 receives signals from data scramble table block 114, test mode register block 112, and test data block 108. Write expansion block 116 expands test data signals TD[0:7] into data signals DQ[0:31] for input into memory device 30 for testing of the same. Read compression block 118 receives signals from data scramble table block 114, test mode register block 112, write expansion block 116, and data send and capture block 126. Read compression block 118 compresses data signals DQ[0:31] from memory device 30 into test data signals TDQ[0:7] for return to external test equipment.

Memory clock driver block 120, command driver block 122, address driver block 124, and data send and capture block 126 may each comprise one or more buffers for outputting or inputting signals to or from an IC device during testing.

Testing component 10 may be initialized, placed into test mode, used for testing, and then taken out of test mode.

For initialization, the testing component 10 is powered up. In one embodiment, the SET and LOAD signals are held low during power-up to ensure all output drivers of testing component 10 (in the memory clock driver block 120, command driver block 122, address driver block 124, and data send and capture block 126) are tri-stated. A RESET signal (active high) may be toggled to clear all registers and latches (e.g., such as those in test mode register block 112), and also to clear all persistent test modes (described herein).

To place testing component 10 in test mode, the TEST signal may be brought and maintained high, which enables the buffers for the SET and LOAD signals. The initial states of the SET and LOAD signals is low (inactive state). The SET and LOAD signals are pulsed high for a period to enable the rest of the buffers in the testing component 10. In one embodiment, all test mode programming is performed asynchronously; no clock is required.

In test mode, the testing component 10 can programmed with test modes, test patterns, and test addresses. The SET and LOAD signals are used to set test modes and enable test address or vectors to be loaded. The SET signal is asserted together with the test code to set test mode. The LOAD signal is then asserted to load the address or test patterns associated with the test mode. In cases where no address or vectors need to be loaded, the LOAD signal may be asserted to confirm (latch) the test mode.

In some embodiment, test modes can be either persistent and non-persistent. Test modes that are non-persistent go away once a new code is programmed. Test modes that are persistent will remain in effect even after a new code is programmed. For programming of the row, column, or test mode register set (MRS) address bits, TDQ[0:7] corresponds to A[0:7], A[8:15], and so on.

Test registers in test mode register block 112 are set using a Test Register Set command and programmed through test data signals TDQ0-TDQ7. In test mode, the I/O pads for TDQ[0:7] signals can be used to read and write test data, set test mode codes, load row and column address, program row and column counter least significant bit (LSB), set data background scramble, and load test data patterns. In one embodiment, the test registers can be set anytime.

An example of a set of test mode codes is shown in the tables of FIGS. 3A and 3B. The external SET signal can be pulsed high with valid test mode codes.

To exit test mode, the TEST signal is brought low to clear all test operations and disable the buffers of testing component 10.

Figure 4:
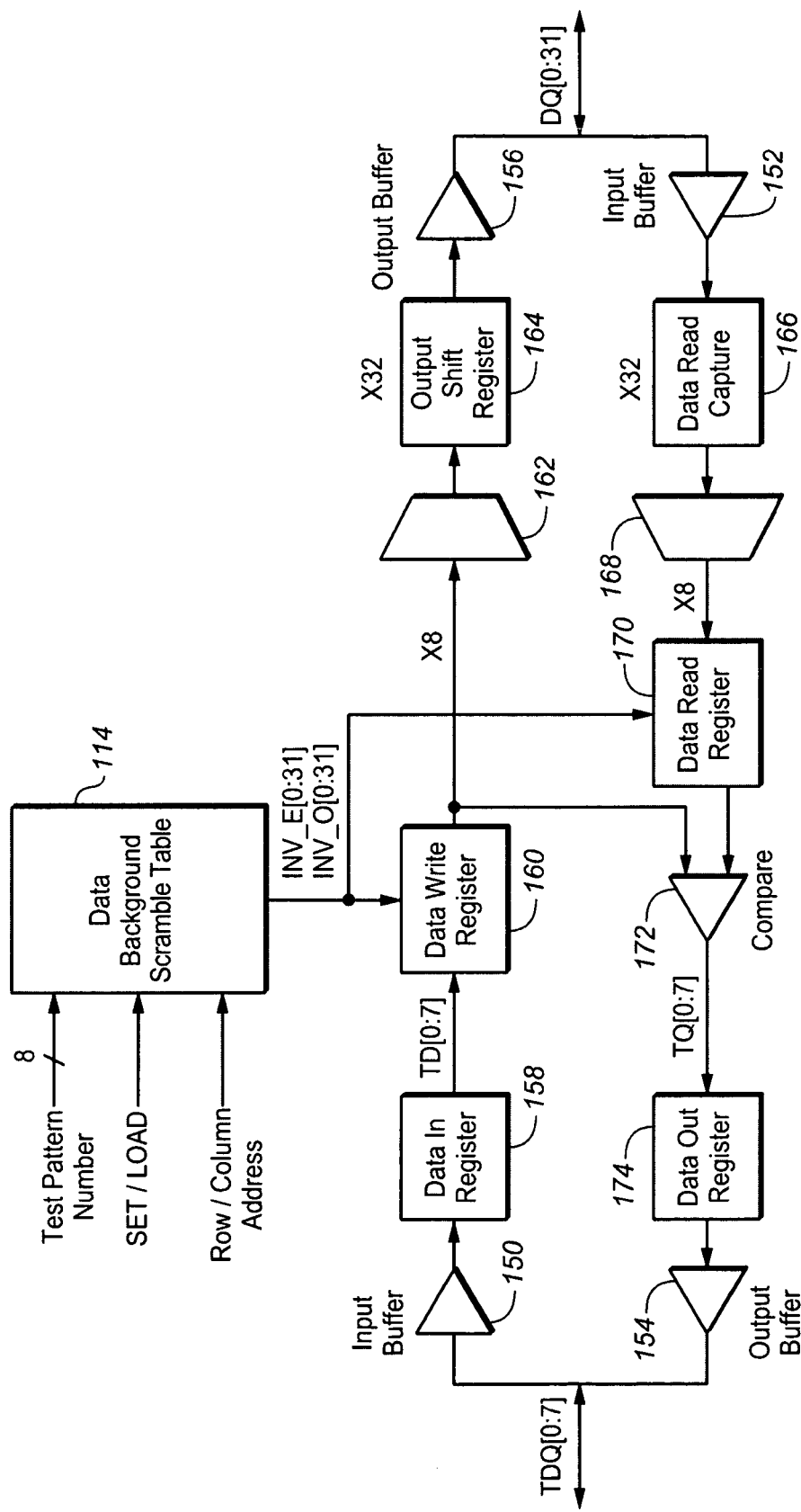
FIG. 4 is a schematic diagram in partial block form of an exemplary implementation of circuitry for the input and output of data signals to and from an integrated circuit device during testing, according to an embodiment of the invention.

FIG. 4 is a schematic diagram in partial block form of an exemplary implementation of circuitry for the input and output of data signals to and from an integrated circuit device during testing, according to an embodiment of the invention.

This circuitry can be located on testing component 10, and may be part of test data block 108, write expansion block 116, read compression block 118, and data send and capture block 126 in the implementation for testing component 10 shown in FIG. 2. As shown, this circuitry of FIG. 4 includes the data scramble table block 114, various input buffers 150, 152, various output buffers 154, 156, a data in register 158, a data write register 160, a multiplexer 162, an output shift register 164, a data read capture block 166, a multiplexer 168, a data read register 170, a compare block 172, and a data out register 174.

The input buffer 150, data in register 158, data write register 160, multiplexer 162, output shift register 164, and output buffer 156 form a data path for writing data into a memory device 30 during testing. The components in the write data path receive external test data signals (TDQ[0:7]) from an external test machine, expand the signals into external data signals (DQ[0:31]), and provide the external data signals to memory device 30.

In one embodiment, the components of the write data path may receive bits of test data from the external test machine at the operating frequency of the test machine, generate multiple bits for each bit of data received from the test machine, and transmit the generated bits to the memory device 30 at the operating frequency of the memory device 30 (which can be higher than the frequency of external test machine). In one example, the components in the write data path may receive a bit of TDQ3 with a value of "1" from the test machine at a frequency of 100 MHz, generate a string of bits "1111" from that received bit by merely repeating the value multiple times, and then provide the string of bits to the memory device 30 as DQ7 at a frequency of 400 MHz. In another example, the components in the write data path may receive a bit of TDQ3 with a value of "1" from the test machine at a frequency of 100 MHz, generate a string of bits "0101" from that received bit on-the-fly, and then provide the string of bits to the memory device 30 as DQ7 at a frequency of 400 MHz. The generation of the string of bits of "0101" from a bit of "1" is accomplished using the data background scramble table 114 which, for example, may provide instructions to "invert every odd bit" in a string of "1111."

The input buffer 152, data read capture block 166, multiplexer 168, data read register 170, compare block 172, data out register 174, and output buffer 154 form a data path for reading data from memory device 30 during testing. The components in the read data path receive external data signals (DQ[0:31]) from memory device 30, compress the signals into external test data signals (TDQ[0:7]), and return the external test data signals to the external test machine.

In one embodiment, the components of the read data path may receive bits of test result from the memory device 30 at the operating frequency of the device 30, translate strings of test result bits into a single bit, and provide the single test result bits to the external test machine at the operating frequency of the test machine. In one example, the components in the write data path may receive a test result bit string of "0011" for DQ18 from memory device 30 at a frequency of 400 MHz. The write data path components may reduce this string to a value of either "0" or "1" depending on whether the string matches an expected test result, and provide the single bit to the external test machine as TDQ5.

The ability of the testing component 10 to "expand" and "compress" between single bits from the test machine and strings of bits from the memory device 30 provides a technical advantage in that device 30 can be tested at the normal operating speed of the memory device using testing equipment which operates at a lower speed.

Figure 5:
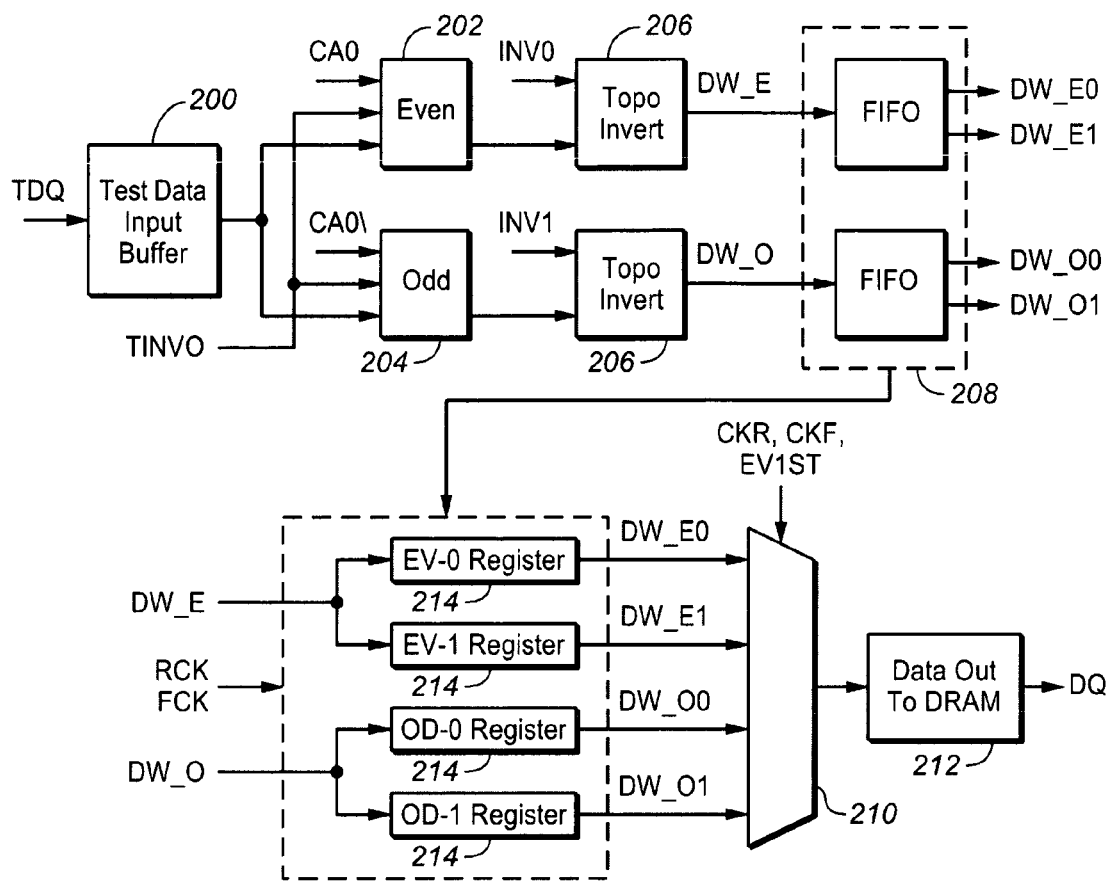
FIG. 5 is a schematic diagram of an exemplary implementation of circuitry for inputting data signals to an integrated circuit device during testing, according to an embodiment of the invention.

FIG. 5 is a schematic diagram of an exemplary implementation of circuitry for inputting data signals to an integrated circuit device during testing, according to an embodiment of the invention. This circuitry can be part of a data path for writing data into a memory device 30 during testing. Basically, this circuitry receives test data in a test data signal (TDQ) at one frequency from a test machine, expands the test data into a plurality of data, and then provides the plurality of data to memory device 30 in a data signal (DQ) at a higher frequency. As depicted this circuitry includes test data input buffer 200, even block 202, odd block 204, topo invert blocks 206, register block 208, multiplexer 210, and data output buffer 212.

The test data input buffer 200 receives and buffers a test data signal (TDQ) from an external test machine. The TDQ signal is provided to even block 202 and odd block 204 along with a test invert odd bit signal (TINVO). The even block 202 receives a burst address LSB signal (CA0) and the odd block receives the complementary signal (CA0\). The even block 202 creates and outputs an even component of data. The odd block 204 creates and outputs an odd component of data.

One topo invert block 206 receives the even component of data from the even block and an invert 0 signal (INV0). The other topo invert block 206 receives the odd component of data from the odd block and an invert 1 signal (INV1). Each topo invert block 206 functions to either invert or not invert the data that it receives, depending on the states of the respective INV0 or INV1 signal. The topo invert blocks 206 output signals data write even (DW_E) and data write odd (DW_O), which are provided to register block 208. The INV0 and INV1 signals going active High invert the incoming data. The DW_E and DW_O signals will be inverted (complement) state of the output of even block 202 and odd block 204, respectively. The INV0 and INV1 signals are generated in the data scramble table block 114. The states of these signals depend on the scramble equation with depends on the architecture and topology of the memory. The equations may comprise row addresses only, or a combination of row and column addresses. For example, to write a solid pattern in the memory array, INV0=(RA0 xor RA1) xor RA8. (Exclusive OR" or "not equal to" function: 0 XOR 0=0, 0 XOR 1=1, 1 XOR 0=1, 1 XOR 1=0). This means that when row address RA0=1 and RA1=0 and RA8=0, INV0=1. And when INV0=1, data is inverted. If the state of data DQ is "1", the state in the memory cell may be "1" or "0" depending on if Bit or Bit\ is accessed. In most cases, INV0 will be the same as INV1, and therefore only one signal is required.

The test machine will drive each TDQ signal (TDQ0 thru TDQ7 in this case). The test machine will drive an input data of "1" or "0" on each TDQ. Using TDQ[0], for example, if input data is "1", the CA0 (LSB of column address) is "0", TINVO="1", then the input to the top TOPO invert block 206 will be "1" and the input to the bottom TOPO invert block 206 will be "0" (TINVO=1 means invert odd bit is active). The TOPO invert blocks 206 will invert the data again if the INV0 or INV1 signal is active. The value of the INV0 or INV1 signal depends on the data scramble table block 114 (see FIG. 2).

In one embodiment, as depicted, the register block 208 can be implemented a plurality of registers 214 (e.g., first-in-first-out (FIFO) registers). Half of these registers can be "even" registers (e.g., EV-0 Register and EV-1 Register), and the other half can be "odd" registers (e.g., OD-0 Register and OD-1 Register). The even registers of register block 208 generate data write even 0 (DW_E0) and data write even 1 (DW_E1) components from the DW_E signal, and the odd registers generates data write odd 0 (DW_O0) and data write odd 1 (DW_O1) components from the DW_O signal.

These DW_E0, DW_E1, DW_O0, and DW_O1 signals are provided in parallel to multiplexer 210. The multiplexer 210 generates a serial stream from the parallel signals. The serial stream is provided to memory device 30 as sequence of data (e.g., 4) in a data signal (DQ) via data output buffer 212. In one embodiment, this serial stream may be provided to multiple pads or inputs of memory device 30.

Figures 6A, 6B, 7A:
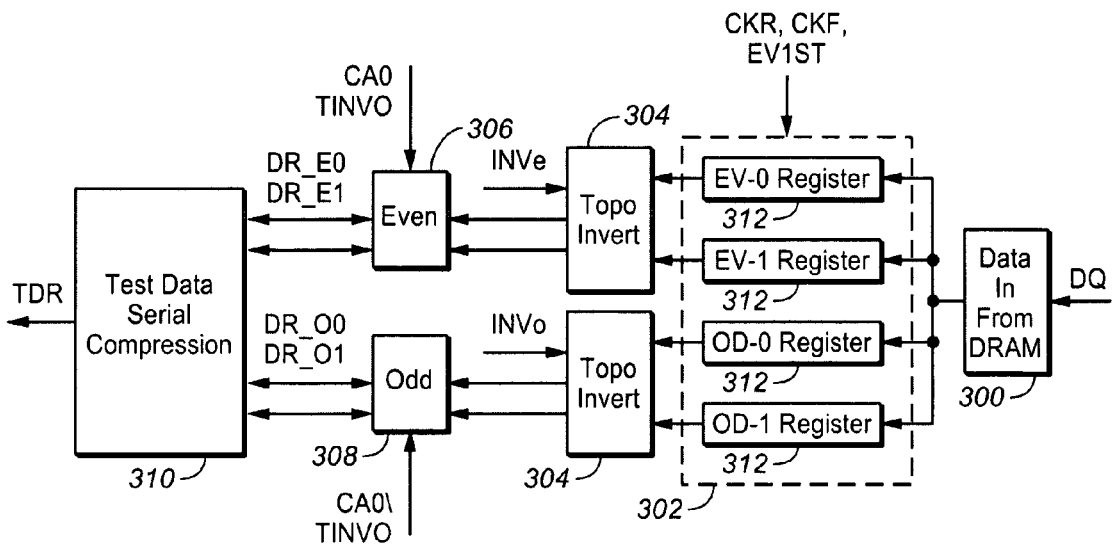
FIGS. 6A and 6B are tables for exemplary data write patterns, according to an embodiment of the present invention.
FIGS. 7A, 7B, and 7C are schematic diagrams of an exemplary implementation of circuitry for outputting signals from an integrated circuit device during testing, according to an embodiment of the invention. Use new

FIGS. 6A and 6B are tables for exemplary data write patterns, according to an embodiment of the present invention. The tables show the DQ signal output from the circuitry of FIG. 5 for various values of TDQ, CA0, CA0\, INV0, and INV1 signals.

Figure 13:
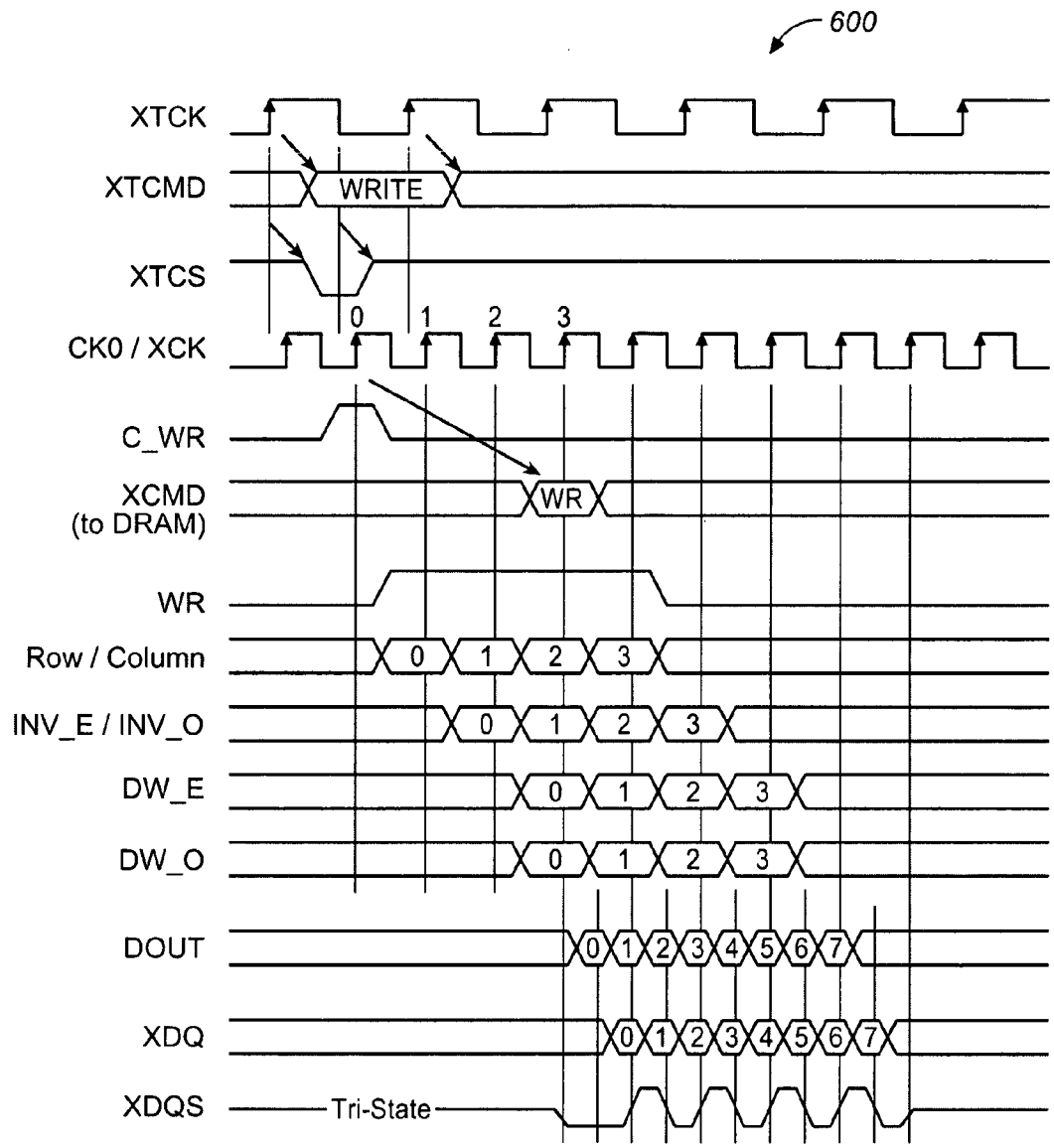
FIG. 13 is an exemplary timing diagram of write sequence, according to an embodiment of the invention.

FIG. 13 is an exemplary timing diagram 600 of write sequence, according to an embodiment of the invention. This write sequence can be performed by the circuitry which is part of the write path in testing component 10 for writing data to a memory device 30 during testing. As shown in timing diagram 600, a WRITE command causes data (XDQ[0:8]) to be output from testing component 10.

Figure 7B:
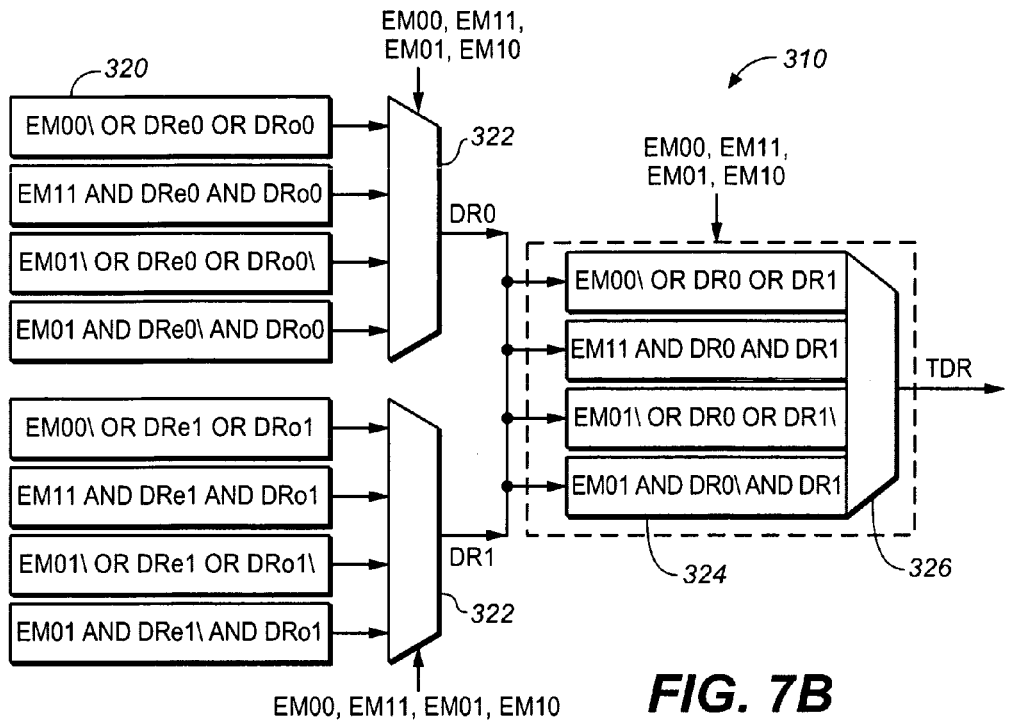
Figure 7C:
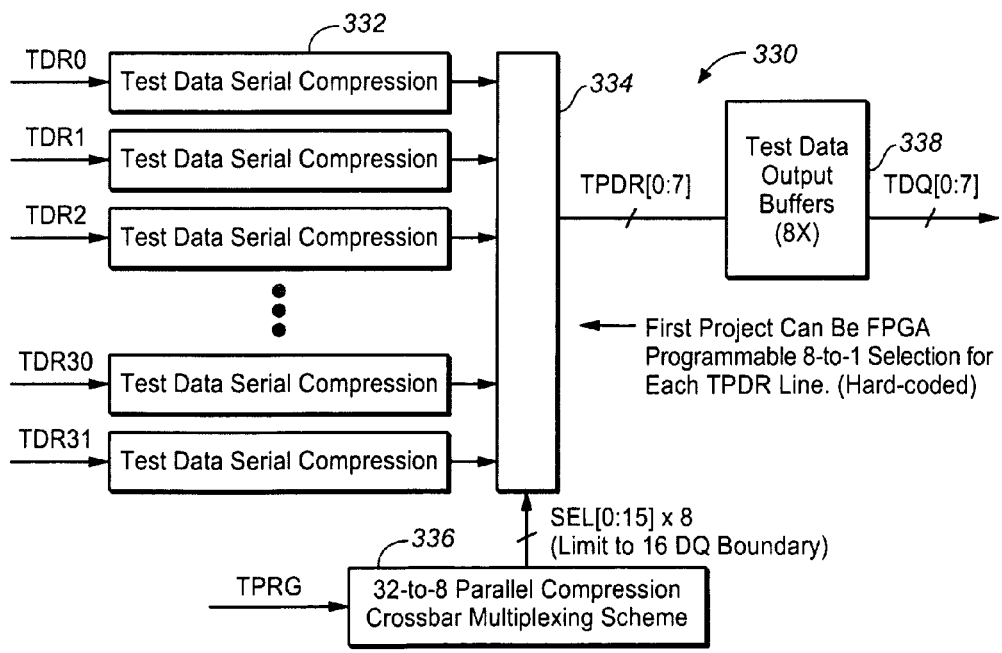

FIGS. 7A, 7B, and 7C are schematic diagrams of an exemplary implementation of circuitry for outputting signals from an integrated circuit device during testing, according to an embodiment of the invention. This circuitry can be part of a data path for reading data from a memory device 30 during testing. Basically, this circuitry receives data in a data signal (DQ) at one frequency from the memory device 30, compresses the data into test data, and then provides the test data to the test machine in a test data signal (TDQ) at a lower frequency. As depicted in FIG. 7A, this circuitry includes data input buffer 300, register block 302, topo invert blocks 304, even block 306, odd block 308, and test data serial compression block 310.

The data input buffer 300 receives and buffers a sequence of data (e.g., 4) conveyed in signal (DQ) from the IC device under test (e.g., memory device 30). The sequence of data in DQ signal is provided to each of a plurality of registers 312 in register block 302. Half of these registers can be "even" registers (e.g., EV-0 Register and EV-1 Register), and the other half can be "odd" registers (e.g., OD-0 Register and OD-1 Register). The data in the DQ signal is distributed equally between the even and odd registers. That is, the even registers of register block 302 operate on an "even" component of data in DQ signal (e.g., the second, fourth, sixth, etc. bits in the DQ signal), and the odd registers of register block 302 operate on an "odd" component of data in DQ signal (e.g., the first, third, fifth, etc. bits in the DQ signal). EV-0 Register receives one-half of the even bits, and EV-1 Register receives the other half of the even bits. OD-0 Register receives one-half of the odd bits, and OD-1 Register receives the other half of the odd bits. Thus, the data of DQ signal is evenly distributed to the registers of register block 302. The registers of register block 302 also receives signals CKR, CKF, EV1ST.

One topo invert block 304 receives the data from the even registers of register block 302 and an invert even signal (INVe). The other topo invert block 304 receives the data from the odd registers of register block 302 and an invert odd signal (INVo). Each topo invert block 304 functions to either invert or not invert the data that it receives, depending on the states of the respective INVe or INVo signal. As described herein, the INVe signal is the same as INV0 signal and the INVo signal is the same as INV1 signal, and as such, in most cases, there will be one common signal INV for each TDQ data path. In one embodiment, since there are eight TDQ signals, there will be eight INV signals (i.e., INV[0:7]). Referring to FIG. 4, INV-E[0:31] and INV-0[0:31] will provide the maximum possible inversion for double-data-rate (DDR) operation with 32 DQ signals. Only eight invert signals are needed if it is assumed that the parallel compressed DQ signals have the same background scramble.

The even block 306 receives the data from the first topo invert block 304 along with a burst address LSB signal (CA0). The odd block 308 receives the data from the second topo invert block 304 and a complementary signal (CA0\). Each of the even and odd blocks 306 and 308 receives a test invert odd bit signal (TINVO). The even block 306 outputs data read even 0 (DR_E0) and data read even 1 (DR_E1) components, and the odd block 308 outputs data read odd 0 (DR_O0) and data read odd 1 (DR_O1) components.

These DW_E0, DW_E1, DW_O0, and DW_O1 signals are provided in parallel to the test data serial compression block 310. The test data serial compression block 310 compresses the data of these parallel signals and generates a serial stream which is output in a TDR signal.

FIG. 7B is a schematic diagram of an exemplary implementation for the test data serial compression block 310. As depicted, test data serial compression block 310 includes a process blocks 320 (only one of which is labeled for clarity), multiplexers 322, process blocks 324 (only one of which is labeled for clarity), and multiplexer 326.

Half of the process blocks 320 are coupled to one multiplexer 322, and the other half of the process blocks 320 are coupled to the other multiplexer 322. Multiplexers 322 each receive enable match (EM) signals EM00, EM11, EM01, and EM10. Each process block 320 receives one data signal (e.g., DRe0) from even block 306 and one data signal (e.g., Dro0) from odd block 308. Each process block 320 will provide an output to the respective multiplexer 322 which is a logical operation of the respective data signals (e.g., DRe0 and Dro0) and one of the EM00, EM11, EM01, and EM10 signals. For example, one process block 320 provides an output which is the result of the following logic operation: EM00\ OR Dre0 OR Dro0. In this path, the expected data for both Dre0 and Dro0 is a logic "0", and therefore the enable signal gating the OR gate is EM00\, which is active Low. Each multiplexer 322 receives and multiplexes the results of the process blocks 320 to which it is coupled. The output of each multiplexer 322 depends on the states of the EM00, EM11, EM01, and EM10 signals. One multiplexer 322 generates a DR0 signal and the other multiplexer 322 generates a DR1 signal. The value of the expected data, plus the value of CA0, TINVO signals will determine the value of EM00, EM01, EM10, and EM11 (only one will be active). In one embodiment, the background scramble INV signals are not necessary as long as the data is compared at the same incoming and outgoing point. In another path (i.e., EM01 AND Dre0\ AND Dro0), the expected data for Dre0 is "0" and Dro0 is "1"; hence, the complement Dre0\="1" is used to input the AND gate to produce a "1" at the output.

The process blocks 324 receive the DR_E signal and DR_O signals, and are coupled to multiplexer 326. Each process block 324 will provide an output to multiplexer 326 which is a logical operation of the DR_E and DR_O signals and one of the EM00, EM11, EM01, EM10, EM01, and EM10 signals. Multiplexer 326 receives and multiplexes the results of the process blocks 324. The output of multiplexer 326 depends on the states of the EM00, EM11, EM01, and EM10, signals. Multiplexer 326 generates the TDR signal.

In one embodiment, multiples of the circuitry of FIGS. 7A and 7B may provided on the testing component 10 as part of the data path for reading data from memory device 30 during testing. Thus, there may be multiple TDR signals—i.e., TDR0, TDR1, . . . , and TDRn. In one embodiment, there are 32 TDR signals (TDR[0:31]).

FIG. 7C is a schematic diagram of an exemplary implementation for a compression block 330 which may receive the multiple TDR signals (e.g., TDR0, TDR1, . . . , and TDR31) from respective test data serial compression blocks 310. As depicted, compression block 330 includes a plurality of test data serial compression blocks 332 (only one of which is labeled for clarity), a multiplexer 334, and selection block 336.

Each test data serial compression blocks 332 receives a respective TDR signal and will provide it to multiplexer 334 depending on selection signals SEL[0:15] from selection block 336. Selection block 336 receives the programming repair signal TST_PRG. Multiplexer 334 outputs a number of TPDR signals in parallel (e.g., TPDR[0:7]). Thus, as shown, multiplexer 334 performs a 32-to-eight multiplex operation on the TDR[0:31] signals.

The output from multiplexer 334 is received by a plurality of test data output buffers 338, which provide the results to testing equipment in signals TDQ[0:7].

FIGS. 8A and 8B are tables for exemplary data read patterns, according to an embodiment of the present invention. The tables show the TDQ signal output from the circuitry of FIGS. 7A, 7B, and 7C for various values of DQ, CA0, CA0\, TINVO, and EM signals.

FIGS. 9A and 9B are tables for exemplary mapping of data (DQ) signals to test data (TDQ) signals, according to an embodiment of the present invention. FIG. 9A shows exemplary DQ to TDQ mapping for X32, X16, X8, and X4 configurations. FIG. 9B shows exemplary DQ to TDQ mapping for X32 and X16 configurations.

Figure 14:
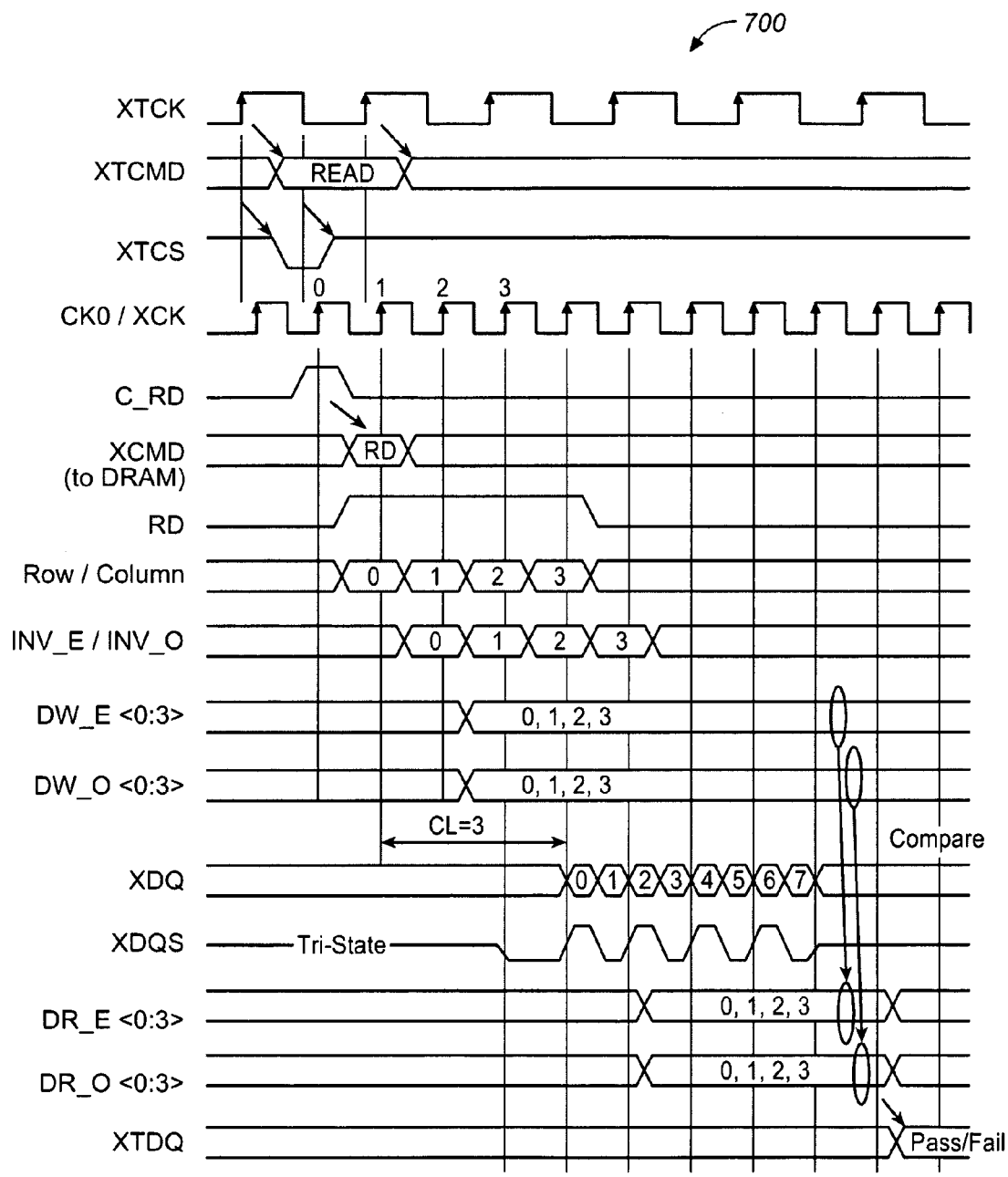
FIG. 14 is an exemplary timing diagram of read sequence, according to an embodiment of the invention.

FIG. 14 is an exemplary timing diagram 700 of read sequence, according to an embodiment of the invention. This read sequence can be performed by the circuitry which is part of the read path in testing component 10 for reading data from a memory device 30 during testing. As shown in timing diagram 700, a READ command causes test data (XTDQ) to be output from testing component 10.

FIG. 10 is an exemplary timing diagram of a sequence 400 for programming repair, according to an embodiment of the invention. Sequence 400 can be used to repair memory device 30.

Referring to FIG. 10, waveforms 402, 404, 406, and 408 are given for the programming repair signal TST_PRG, the SET signal, the LOAD signal, and one or more TDQ signals. The one or more TDQ signals may be used to, for example, read and write test data, set test mode codes, load row and column addresses, program least significant bits (LSB) for row and column counters, and load test data patterns. In one embodiment, there can be eight TDQ signals: TDQ[0:7]. As the exemplary waveforms in FIG. 10 illustrate, the programming to repair memory device 30 can be performed asynchronously (i.e., without a clock signal).

The SET and LOAD signals are used to input codes for setting test modes and enable test address or vectors to be loaded. These codes may be provided in the one or more TDQ signals. The codes can indicate or represent, for example, any of the following: no test, load row address mode, reserve, load column address mode, set row counter LSB, set/load test data background equations, all even row enable, all odd row enable, disable all pumps and regulators, disable redundant rows and columns, set column counter LSB, start test counter, load data pattern, set row counter count down, set column counter count down, and individual DQ access mode.

For example, in one embodiment, to load an initial burst column address (i.e., the starting address in a column burst counter), the following command is issued using the timing shown in FIG. 10:

SET=1 with TDQ[7:0]=00001xxx→ this sets the LCA07"Load Column Address" bit active (e.g., LCA=1).

LOAD=1 with TDQ[7:0]="start address"→ load value at TDQs to the column address counter.

In one embodiment, RCNTD and LCA07 can be set at the same time with SET=1 and TDQ[7:0]=00 001 111; and then start address for LCA07 register can be loaded using TDQ[0:7] signals again.

For setting just a test mode (e.g., disabling a voltage regulator, setting access phase (i.e., TCNT=1), or setting 8X parallel test modes), then the SET signal in combination with valid TDQs is sufficient. In one embodiment, test modes can be persistent or non-persistent. Test modes that are non-persistent go away once a new code is programmed within the same TEST-SET table. Test modes that are persistent will remain in effect even after a new code is programmed.

The waveforms shown in FIG. 10 can be used for programming the anti-fuse. The "programming voltage" is separate.

Figure 11:
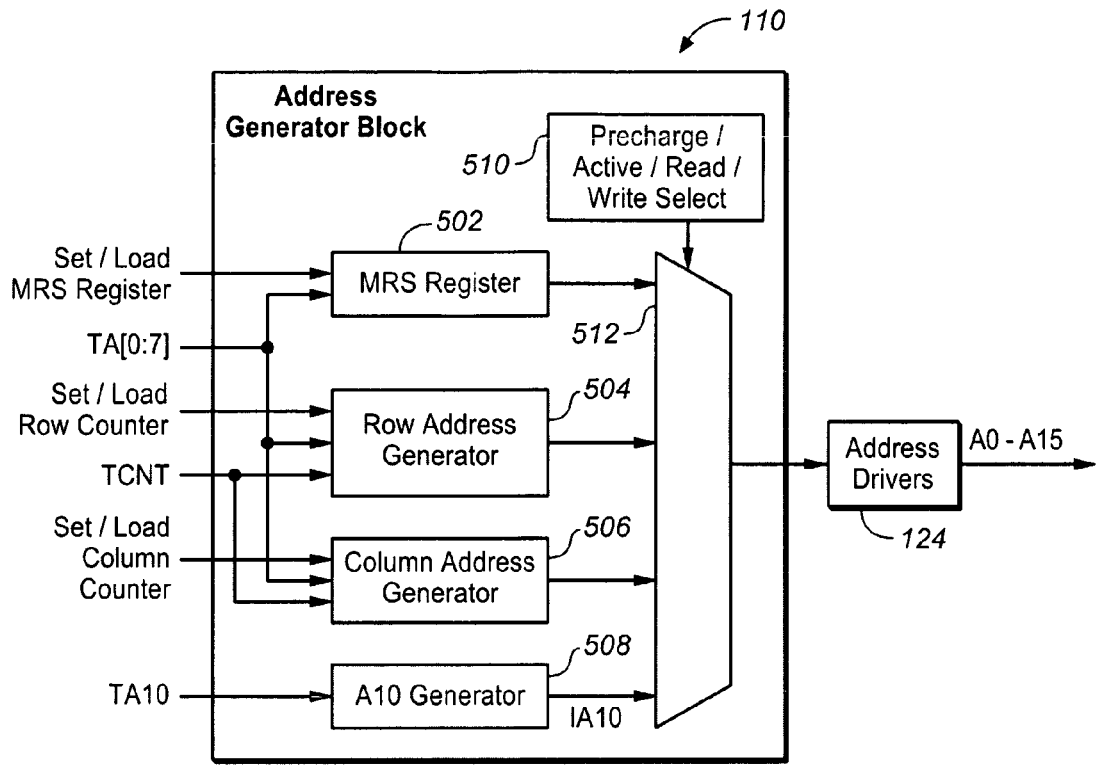
FIG. 11 is a schematic diagram of an exemplary implementation for an address generator block, according to an embodiment of the invention.

FIG. 11 is a schematic diagram of an exemplary implementation for an address generator block 110, according to an embodiment of the invention. Address generator block 110 generates a plurality of address signals (A[0:15]) for use in testing memory device 30. These address signals are provided to memory device 30 through address drivers 124. As depicted, address generator block 110 comprises a mode register set (MRS) register 502, a row address generator 504, a column address generator 506, an A10 generator 508, a select block 510, and a multiplexer 512.

The MRS register 502 receives the SET, LOAD, mode register set (MRS), and test address (TA[0:7]) signals. The row address generator 504, which receives the SET, LOAD, and TCNT signals and a row counter signal, generates a plurality of row addresses for use in testing memory device 30. Similarly, the column address generator 506, which receives the SET, LOAD, and TCNT signals and a column counter signal, generates a plurality of column addresses for use in testing memory device 30. The A10 generator 508 receives a TA10 signal. The TA10 signal is used to separately control the A10 bit. The A10 bit enables the DRAM auto-precharge, All-bank command. The multiplexer 512 receives and multiplexes the outputs of the MRS register 502, row address generator 504, column address generator 506, and A10 generator 508 based on signals from the select block 510. The output of multiplexer 512 is provided to the addresses drivers 124.

In one embodiment, the testing component 10 provides memory addresses at about the same time that an external tester issues an access command. When Active command is scheduled, multiplexer 512 will select the Address bits from the row address generator 504 to be sent to the address drivers 124. The testing component 10 will send the Active command (CS/RAS/CAS/WE=0011) and the accompanying address bits A[0:13] (for 512 Mb×8 DRAM) to the DRAM under test. When Read command is scheduled, multiplexer 512 will select the address bits from the column address generator 506 to be sent to the address drivers 124. The testing component 10 will send the Read command (CS/RAS/CAS/WE=0101) and the accompanying address A[0:9] (512 Mb×8 DRAM) and A10 (for auto-precharge or no auto-precharge). Similar events occur for Write operation and Load mode register operation that involves sending the address bits.

Figure 12:
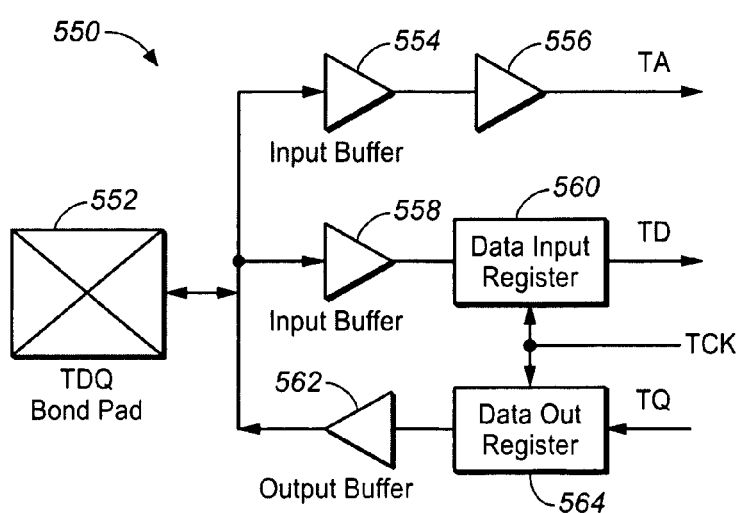
FIG. 12 is a schematic diagram of an exemplary implementation for input/output circuitry, according to an embodiment of the invention.

FIG. 12 is a schematic diagram of an exemplary implementation for input/output (I/O) circuitry 550, according to an embodiment of the invention. This I/O circuitry 550, which can be part of test data block 108 of testing component 10, receives and outputs a test data signal (TDQ) from and to external test equipment. In one embodiment, a separate I/O circuitry 550 is provided for each TDQ signal. As shown, the I/O circuitry 550 comprises a TDQ bond pad 552, input buffers 554, 556, and 558, output buffer 562, data input register 560, and data output register 564.

A signal received at TDQ pad 552 of I/O circuitry 550 can be used for generating either data or address information for use in testing memory device 30. If the signal is to be used for address generation, it is provided as a test address (TA) signal through input buffers 554 and 556. If the signal is to be used for data generation, it is provided as a test data (TD) signal through input buffer 558 and data input register 560. A signal to be output from I/O circuitry 550 is received at data out register 564, and driven out at TDQ bond pad 552 by output buffer 562.

Figure 15:
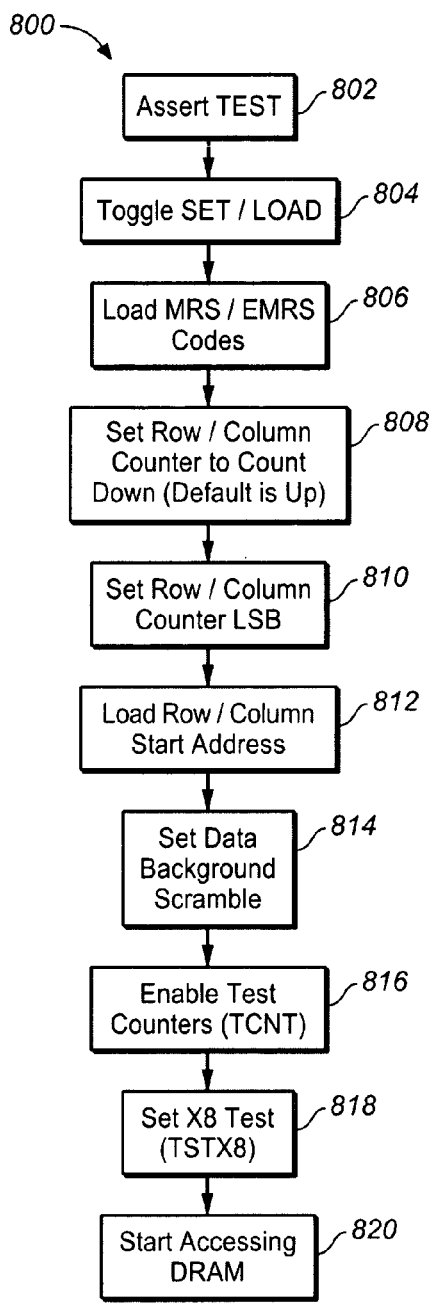
FIG. 15 is an exemplary flowchart of method for placing an integrated circuit device into condition for testing, according to an embodiment of the invention.

FIG. 15 is an exemplary flowchart of method 800 for placing an integrated circuit device into condition for testing, according to an embodiment of the invention. In some embodiments, the method 800 may be performed by testing component 10. Method 800 begins at block 802 where the TEST signal is asserted to place the components of a module (i.e., first IC device 10, second IC device 20, and testing component 10) into test mode. In some embodiments, the TEST signal is made a high value (or "1", such as VDD) and remains high throughout testing. At block 802, the SET and LOAD signals are toggled, which enables the input buffers in test DQ block 108 of testing component 10. In some embodiments, the SET and LOAD signals are initially at a low value (or "0", such as GND). Then the SET and LOAD signals are pulsed high for predetermined periods (e.g., 10 ns). At block 806, test codes are loaded into testing component 10 as part of the programming phase of test mode. At block 808, counters in the address generator 110 of testing component 10 are set to count up or count down in order to generate patterns to be used as addresses for testing memory device 30. At block 810, a least significant bit (LSB) for counting is set for the counters in address generator 110. At block 812, a starting address is loaded for the rows and columns. At block 814, the data scramble table block 114 of the testing component 10 is set. At block 816, test counters (TCNT) are enabled. TCNT enables the row address counter in the row address generator block 504, and enables the column address counter in the column address generator block 506. At block 818, the X8 Test (TSTX8) is set. TSTX8 enables the test data path. When TSTX8 is inactive, the output buffer and input buffer of TDQ data path (TD and TQ) are disabled; i.e. the output is tri-stated. This ensures that the testing component 10 does not interfere with the normal ASIC-DRAM operation. At step 820, accessing of the memory device 30 is started for testing of the same.

Figure 16:
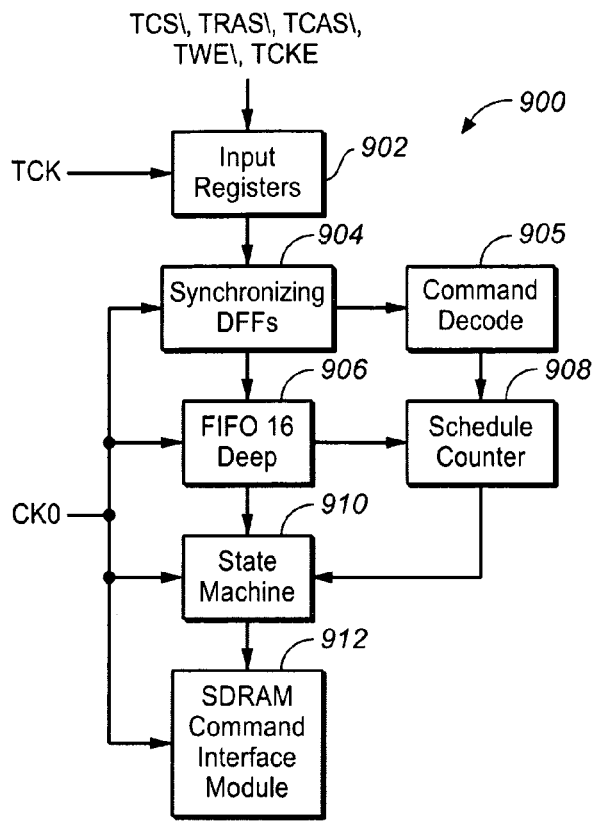
FIG. 16 is diagram for input command synchronization and scheduling, according to an embodiment of the invention.

FIG. 16 is diagram 900 for input command synchronization and scheduling, according to an embodiment of the invention. Synchronization of a test input command is necessary when the test operating frequency (from a test machine) is less than the operating frequency of the device to be tested (e.g., memory device 30). For example, the input tester clock frequency can be 100 Mhz with ±800 ps clock-to-clock jitter. The operating frequency of the target memory interface can be 500 Mhz. The test input commands are registered in input registers 902 using the rising edge of the test clock signal TCK.

The registered input command should be synchronized with a clock frequency (for example, that of a field programmable gate array (FPGA)) which is running at more than twice the TCK frequency. The FPGA clock, CK0, is generated in the FPGA clock manager logic whose input is from an external crystal oscillator or phase locked loop (PLL).

Because of the asynchronous nature of TCK and CK0, and the fact that the TCK signal may be significantly slower than the CK0 signal (e.g., half as fast), a command decoder and scheduler 905, 901 is used to ensure that the minimum AC timing between commands can be achieved. The test input commands are registered in the FPGA using TCK. Two additional D-flip flops (DFFs) 904 are provided series to synchronize the registered input command with the internal clock frequency that is running at more than twice the frequency of the TCK signal.

The input command is stored in a first-in-first-out (FIFO) register 906 and schedule counter 908 will count to the clock (CK) cycles required before sending the command out to the memory device 30. A state machine 910 and a command interface module 912 are also provided. State machine 90, which can be implemented as a finite state machine, supports the memory control functions—such as memory activation and precharge; when to select the row address, column address, etc; when to issue read or write commands, counting of the burst lengths and CAS latency, when to receive/register incoming data, etc. Command interface 912, which can be an implementation of the command drivers 122 in FIG. 2, drives command signals to the memory device (e.g., DRAM).

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A system comprising:
   a first integrated circuit device;
   a second integrated circuit device implemented on a first monolithic die and connected to the first integrated circuit device, wherein the first and second integrated circuit devices operate in conjunction in a normal operation; and
   a testing component implemented on a second monolithic die and operable to be connected between an external test machine and the second integrated circuit device for testing of the second integrated circuit in a test mode, wherein the testing component allows the external test machine to test the second integrated circuit device in the test mode.

2. The system of claim 1, wherein the first integrated circuit is implemented on a third monolithic die.

3. The system of claim 2, wherein:
   the first integrated circuit exchanges signals with external circuitry over a first group of external connectors during normal operation; and
   the testing component exchanges signals with the external test machine over the first group of external connectors during test mode.

4. The system of claim 1, wherein the first integrated circuit is implemented on the second monolithic die.

5. The system of claim 1, wherein the first integrated circuit device and the second integrated circuit device are contained in a first package.

6. The system of claim 5, wherein the testing component is contained in a second package.

7. The system of claim 6, wherein:
   the first integrated circuit exchanges signals with external circuitry over a first group of external connectors during the normal operation; and
   the testing component exchanges signals with the external test machine over the first group of external connectors during the test mode.

8. The system of claim 6, wherein the first package and the second package are contained in a third package.

9. The system of claim 5, wherein the testing component shares at least one external connector with the first integrated circuit device.

10. The system of claim 1, wherein the first integrated circuit device, the second integrated circuit device, and the testing component are contained in a single package.

11. The system of claim 10, wherein the testing component shares at least one external connector with the first integrated circuit device.

12. The system of claim 1, wherein:
   the first integrated circuit exchanges signals with external circuitry over a first group of external connectors during the normal operation; and
   the testing component exchanges signals with the external test machine over the first group of external connectors during the test mode.

13. The system of claim 1, wherein the testing component is incorporated in the external test machine.

14. The system of claim 1, wherein the testing component is incorporated on a load board in the external test machine.

15. The system of claim 1, wherein:
   the second integrated circuit device operates at a first frequency,
   the external test machine provides signals at a second frequency which is lower than the first frequency, and
   the testing component processes the signals from the external test machine to generate signals at the first frequency, the testing component providing the signals at the first frequency to the second integrated device during the test mode.

16. The system of claim 1, wherein:
   the second integrated circuit device operates at a first frequency,
   the external test machine operates at a second frequency which is lower than the first frequency, and
   the testing component converts signals received from the external test machine from the second frequency to the first frequency, and converts signals received from the second integrated Circuit device from the first frequency to the second frequency.

17. The system of claim 1, wherein the second integrated circuit is not directly accessible by the external test machine.

18. The system of claim 1, wherein the external test machine can only access the second integrated circuit device through the testing component.

19. The system of claim 1, wherein signals from the first integrated circuit device are tri-stated during the test mode.

20. The system of claim 1, wherein the external test machine provides instructions to the testing component for setting test modes and loading test vectors in order to test the second integrated circuit device.

21. The system of claim 1, wherein the first integrated circuit device comprises memory cells which can substitute for memory cells in the second integrated circuit device.

22. The system of claim 1, wherein the first integrated circuit device comprises memory cells for storing chip identification information.

23. The system of claim 1, wherein the testing component allows the monitoring of an exchange of signals between the first integrated circuit device and the second integrated circuit device.

24. The system of claim 1, wherein the testing component is operable to generate data patterns for testing of the second integrated circuit device.

25. The system of claim 1, wherein the testing component is operable to generate address patterns for testing of the second integrated circuit device.

26. The system of claim 1, wherein a first number of signals are communicated between the first and second integrated circuit devices during normal operation and a second number of signals are communicated between the testing component and the external test machine during test mode, and wherein the second number of signals is less than the first number of signals.

27. A system comprising:
a first integrated circuit device implemented on a first monolithic die;
a second integrated circuit device implemented on the first monolithic die and connected to the first integrated circuit device, wherein the second integrated circuit device communicates with the first integrated circuit device to process information during a normal operation; and
a testing component operable to be connected between an external test machine and the second integrated circuit device for testing of the second integrated circuit in a test mode, wherein the testing component is implemented on a second monolithic die, wherein the testing component allows the external test machine to test the second integrated circuit device during a test mode.

28. The system of claim 27, wherein:
the first integrated circuit exchanges signals with external circuitry over a first group of external connectors during the normal operation; and
the testing component exchanges signals with the external test machine over the first group of external connectors during the test mode.

29. The system of claim 27, wherein the testing component is incorporated in the external test machine.

30. The system of claim 27, wherein: p1 the second integrated circuit device operates at a first frequency,
the external test machine provides signals at a second frequency which is lower than the first frequency, and
the testing component processes the signals from the external test machine to generate signals at the first frequency, the testing component providing the signals at the first frequency to the second integrated device during the test mode.

31. The system of claim 27, wherein the external test machine can only access the second integrated circuit device through the testing component.

32. The system of claim 27, wherein the external test machine provides instructions to the testing component for setting test modes and loading test vectors in order to test the second integrated circuit device.

33. The system of claim 27, wherein the external test machine can only access the second integrated circuit device through the testing component.

34. The system of claim 27, wherein during the test mode signals from the first integrated circuit device are tri-stated.

35. The system of claim 27, wherein the external test machine provides instructions to the testing component for setting test modes and loading test vectors in order to test the second integrated circuit device.

36. The system of claim 27, wherein the testing component allows the monitoring of an exchange of signals between the first integrated circuit device and the second integrated circuit device.

37. A system comprising:
a first integrated circuit device implemented on a first monolithic die;
a second integrated circuit device implemented on a second monolithic die and connected to the first integrated circuit device, wherein the first and second integrated circuit devices operate in conjunction in a normal operation;
a testing component operable to be connected between an external test machine and the second integrated circuit device for testing of the second integrated circuit in a test mode, wherein the testing component allows the external test machine to test the second integrated circuit device in a test mode.

38. The system of claim 37, wherein the testing component is implemented on the first monolithic die.

39. The system of claim 37, wherein the testing component is implemented on the second monolithic die.

40. The system of claim 37, wherein the testing component is implemented on a third monolithic die.

41. The system of claim 40, wherein:
the first integrated circuit exchanges signals with external circuitry over a first group of external connectors during the normal operation; and
the testing component exchanges signals with the external test machine over the first group of external connectors during the test mode.

42. The system of claim 37, wherein the first monolithic die and the second monolithic die are contained in a single package.

43. The system of claim 42, wherein the testing component shares at least one external connector with the first integrated circuit device.

44. The system of claim 37, wherein the first monolithic die is contained in a first package and the second monolithic die is contained in a second package.

45. The system of claim 44, wherein the first package and the second package are contained in a third package.

46. The system of claim 37, wherein:
the second integrated circuit device operates at a first frequency,
the external test machine operates at a second frequency which is lower than the first frequency, and
the testing component converts signals received from the external test machine from the second frequency to the first frequency, and converts signals received from the second integrated circuit device from the first frequency to the second frequency.

47. The system of claim 37, wherein the testing component is incorporated in the external test machine.

48. The system of claim 37, wherein the external test machine can only access the second integrated circuit device through the testing component.

49. The system of claim 37, wherein the external test machine provides instructions to the testing component for setting test modes and loading test vectors in order to test the second integrated circuit device.

50. The system of claim 37, wherein the first integrated circuit device comprises memory cells which can substitute for memory cells in the second integrated circuit device.

51. The system of claim 37, wherein the testing component allows the monitoring of an exchange of signals between the first integrated circuit device and the second integrated circuit device.

52. A testing component for testing of a system comprising a first integrated circuit device connected to and operable to operate in conjunction with a second integrated circuit device, wherein the first integrated circuit device is implemented on a first monolithic die and the second integrated circuit device is implemented on a second monolithic die, the testing component comprising:

circuitry for receiving bits of test data from an external test machine at a first frequency;

circuitry for generating a string of bits for each bit of test data from the external test machine; and circuitry for providing the generated bit strings to the second integrated circuit device at a second frequency, wherein the second frequency is higher than the first frequency.

53. The testing component of claim 52, wherein the circuitry for generating the strings of bits comprises a data scramble table block.

54. The testing component of claim 52, comprising:

circuitry for receiving strings of test result data from the second integrated at the second frequency;

circuitry for generating a bit for each string of test result data from the second integrated circuit; and circuitry for providing the generated bits to the external test machine at the first frequency.

* * * * *